(12) United States Patent
Choung et al.

(10) Patent No.: US 10,629,847 B2
(45) Date of Patent: Apr. 21, 2020

(54) ORGANIC LIGHT-EMITTING DISPLAY DEVICE AND METHOD OF MANUFACTURING THE SAME

(71) Applicant: Samsung Display Co., Ltd., Yongin-si (KR)

(72) Inventors: Jiyoung Choung, Yongin-si (KR); Younggil Kwon, Yongin-si (KR); Duckjung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/524,941

(22) Filed: Jul. 29, 2019

(65) Prior Publication Data

US 2019/0355932 A1 Nov. 21, 2019

Related U.S. Application Data

(62) Division of application No. 15/239,078, filed on Aug. 17, 2016, now Pat. No. 10,403,853.

(30) Foreign Application Priority Data

Jun. 16, 2016 (KR) .......................... 10-2016-0075090

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3246* (2013.01); *H01L 27/3276* (2013.01);
(Continued)

(58) Field of Classification Search
CPC ............. H01L 51/5253; H01L 27/3246; H01L 27/3276; H01L 51/0016; H01L 51/5012;
(Continued)

(56) References Cited

U.S. PATENT DOCUMENTS 8,035,296 B2 10/2011 Shiozaki
8,846,301 B2 9/2014 Ober et al.
(Continued)

FOREIGN PATENT DOCUMENTS

EP 2 003 713 12/2008
KR 10-2014-0082089 7/2014

OTHER PUBLICATIONS

Extended European Search Report dated Nov. 11, 2017, in European Application No. 16185355.1.
(Continued)

*Primary Examiner* — Peter Bradford
(74) *Attorney, Agent, or Firm* — H.C. Park & Associates, PLC

(57) ABSTRACT

An organic light-emitting display device includes: first and second pixel electrodes (PEs); a pixel-defining layer (PDL) disposed on the first and second PEs, the pixel-defining layer including first and second openings respectively exposing the first and second PEs; first and second intermediate layers (ILs) respectively disposed on the first and second PEs exposed via the first and second openings, each of the first and second ILs including an emission layer; first and second opposite electrodes (OEs) respectively disposed on the first and second ILs, the first and second OEs having an island-shaped pattern; first and second protective layers (PLs) respectively disposed on the first and second OEs, the first and second PLs having an island-shaped pattern; and a connection layer disposed on the first and second PLs, the connection layer electrically connecting the first and second OEs to one another.

16 Claims, 29 Drawing Sheets

(51) Int. Cl.
*H01L 51/50* (2006.01)
*H01L 51/00* (2006.01)
*H01L 51/56* (2006.01)

(52) U.S. Cl.
CPC ...... *H01L 51/0016* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/56* (2013.01); *H01L 2227/323* (2013.01); *H01L 2251/301* (2013.01)

(58) Field of Classification Search
CPC ............ H01L 51/5056; H01L 51/5072; H01L 51/5088; H01L 51/5092; H01L 51/5206; H01L 51/5221; H01L 51/56; H01L 2227/323; H01L 2251/301
See application file for complete search history.

(56) References Cited

U.S. PATENT DOCUMENTS

| | | | |
|---|---|---|---|
| 8,871,545 | B2 | 10/2014 | Lee et al. |
| 9,054,341 | B2 | 6/2015 | Kim et al. |
| 9,091,913 | B2 | 7/2015 | Katz et al. |
| 2003/0201716 | A1 | 10/2003 | Yamazaki et al. |
| 2005/0212003 | A1* | 9/2005 | Murakami .......... H01L 51/5088 257/98 |
| 2008/0012016 | A1 | 1/2008 | Inoue et al. |
| 2008/0309231 | A1 | 12/2008 | Shiozaki |
| 2009/0302755 | A1* | 12/2009 | Racine .................. H05B 33/26 313/505 |
| 2013/0328022 | A1* | 12/2013 | Choi .................. H01L 51/5008 257/40 |
| 2014/0097415 | A1 | 4/2014 | Byun |
| 2014/0124751 | A1 | 5/2014 | Choi et al. |
| 2014/0175390 | A1 | 6/2014 | Kim et al. |
| 2014/0183479 | A1* | 7/2014 | Park ...................... H01L 51/56 257/40 |
| 2014/0183501 | A1 | 7/2014 | Kim et al. |
| 2014/0319481 | A1 | 10/2014 | Lee et al. |
| 2015/0097171 | A1* | 4/2015 | Kim .................... H01L 27/3246 257/40 |
| 2015/0243716 | A1 | 8/2015 | Kwon et al. |
| 2016/0072095 | A1 | 3/2016 | Nakajima et al. |
| 2016/0104859 | A1 | 4/2016 | Kim et al. |
| 2016/0248039 | A1* | 8/2016 | Choung ............. H01L 51/5228 |
| 2017/0179208 | A1* | 6/2017 | Jang ................... H01L 27/3246 |
| 2017/0358633 | A1* | 12/2017 | Park ................... H01L 27/3246 |

OTHER PUBLICATIONS

Non-Final Office Action dated Oct. 15, 2018, in U.S. Appl. No. 15/239,078.
Notice of Allowance dated May 2, 2019, in U.S. Appl. No. 15/239,078.
Patent Gazette Published dated Dec. 21, 2019, in Taiwanese Patent Application No. 105126895.

* cited by examiner

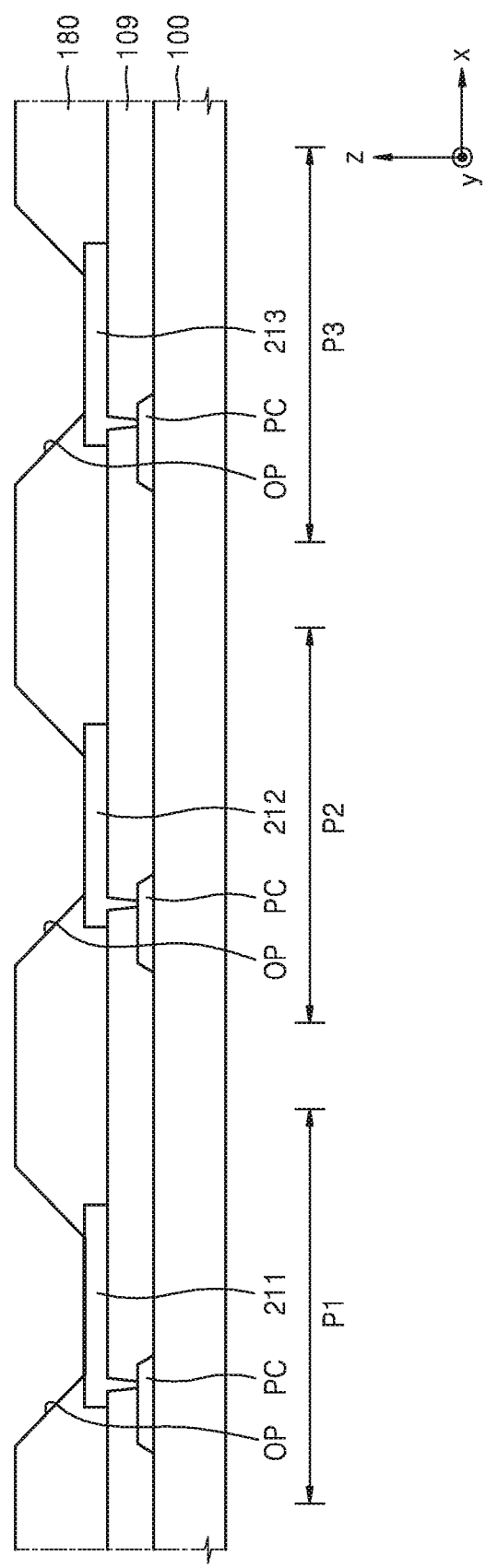

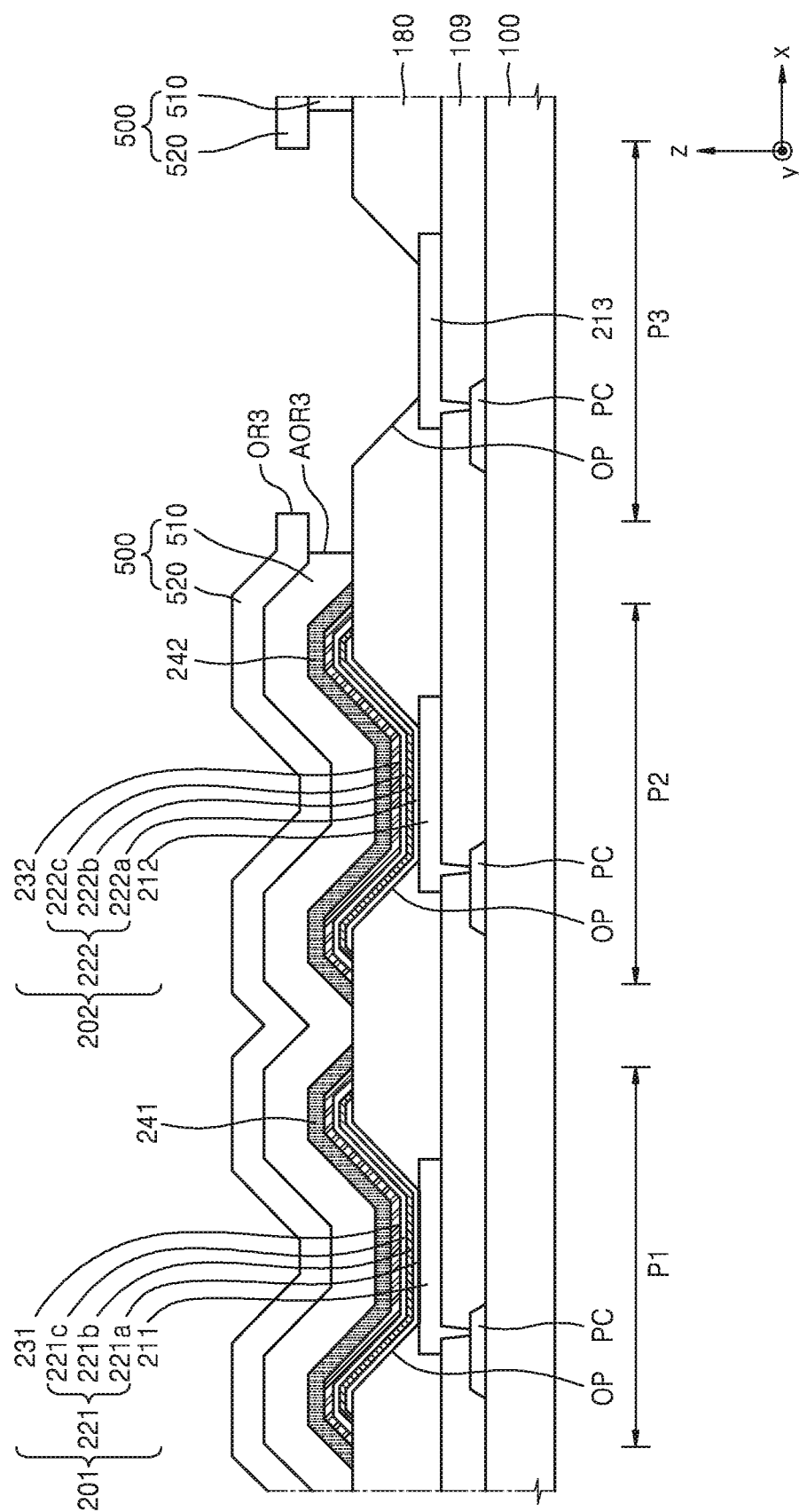

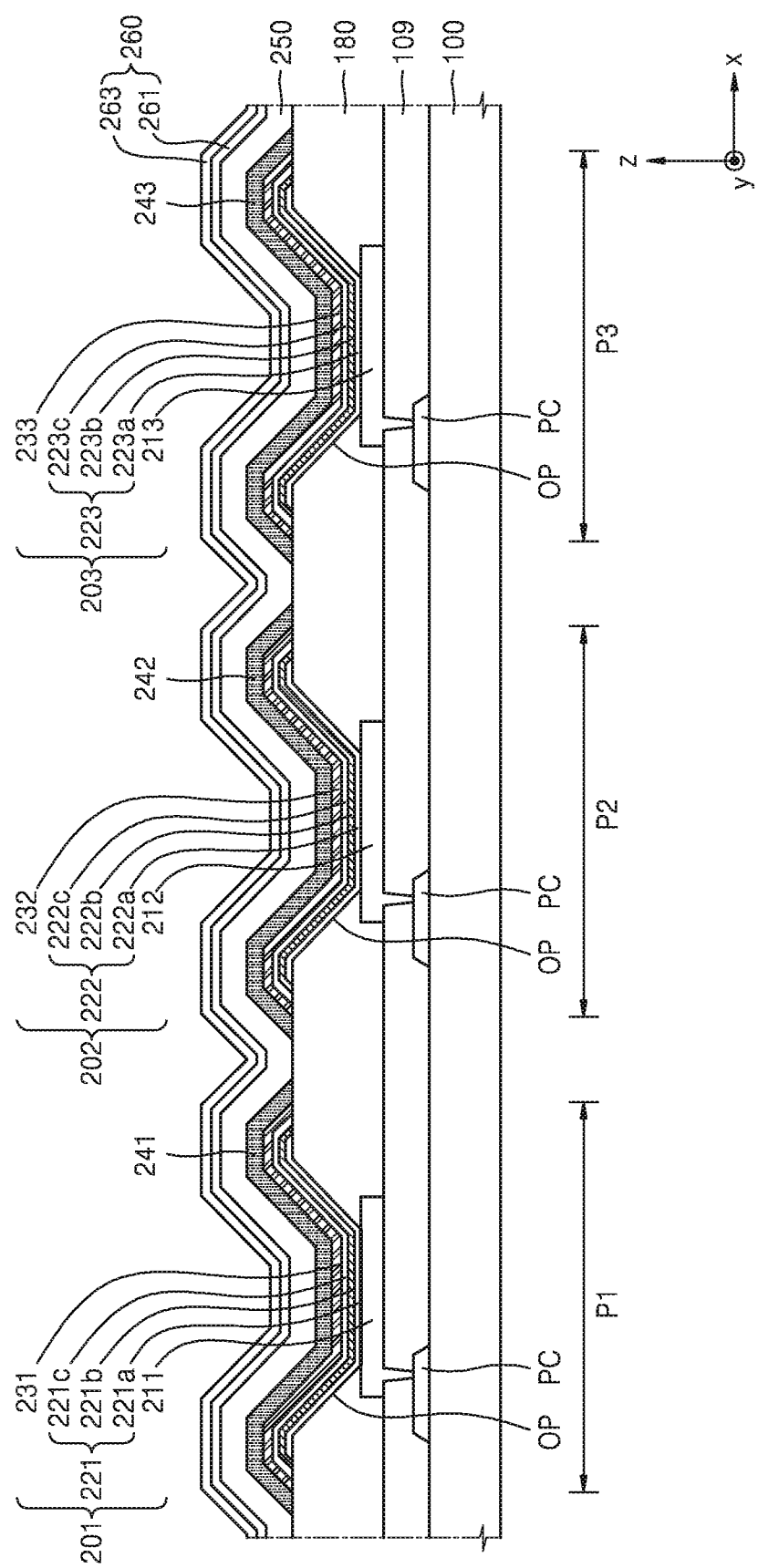

ORGANIC LIGHT-EMITTING DISPLAY DEVICE AND METHOD OF MANUFACTURING THE SAME

CROSS-REFERENCE TO RELATED APPLICATIONS

This application is a Divisional of U.S. patent application Ser. No. 15/239,078, filed Aug. 17, 2016, which claims priority from and the benefit of Korean Patent Application No. 10-2016-0075090, filed Jun. 16, 2016, each of which is hereby incorporated by reference for all purposes as if fully set forth herein.

BACKGROUND

Field

One or more exemplary embodiments relate to display technology, and, more particularly, to organic light-emitting display devices and methods of manufacturing the same.

Discussion of the Background

The appeal of organic light-emitting display devices is unequivocal. Not only do organic light-emitting display devices have a lightweight, slim profile, but they also exhibit advantages, such as wide viewing angles, fast response speeds, and low power consumption. Cost-effective manufacturing of organic light-emitting display devices at high volume with acceptable yield is challenging.

Conventionally, formation of an organic light-emitting display device capable of producing a full range of colors via light of different colors emitted by each pixel region uses a deposition mask to form an organic emission layer for each pixel. As resolution increases, the width of a slit opening in a deposition mask used to form the organic emission layer decreases. To this end, reducing dispersion also becomes of interest. Moreover, manufacture of relatively high resolution organic light-emitting display devices involves reducing or removing a shadow effect of the deposition mask. To address at least some of the above-noted issues, a deposition process may be performed with a substrate attached to the deposition mask. It is noted, however, that such processes may cause, at least in part, a defect (e.g., a mask imprinting defect or phenomenon) to occur. Arranging a spacer above a pixel-defining layer may be used to reduce or prevent such defects, but this involves an additional process and the thickness of the organic light-emitting display device is increased due to the presence of the spacer.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments are directed towards organic light-emitting display devices and methods of manufacturing the same that may enable easier formation of an emission layer and an electrode of an organic light-emitting diode that may also protect (or at least reduce damage to) the organic light-emitting diode.

Additional aspects will be set forth in the detailed description which follows, and, in part, will be apparent from the disclosure, or may be learned by practice of the inventive concept.

According to one or more exemplary embodiments, an organic light-emitting display device includes: first and second pixel electrodes; a pixel-defining layer; first and second intermediate layers; first and second opposite electrodes; first and second protective layers, and a connection layer. The pixel-defining layer is disposed on the first and second pixel electrodes. The pixel-defining layer includes first and second openings respectively exposing the first and second pixel electrodes. The first and second intermediate layers are respectively disposed on the first and second pixel electrodes exposed via the first and second openings. Each of the first and second intermediate layers include an emission layer. The first and second opposite electrodes are respectively disposed on the first and second intermediate layers. The first and second opposite electrodes have an island-shaped pattern. The first and second protective layers are respectively disposed on the first and second opposite electrodes. The first and second protective layers have an island-shaped pattern. The connection layer is disposed on the first and second protective layers. The connection layer electrically connects the first and second opposite electrodes to one another.

According to one or more exemplary embodiments, a method of manufacturing an organic light-emitting display device includes: forming first and second pixel electrodes on a substrate; forming a pixel-defining layer on the first and second pixel electrodes, the pixel-defining layer comprising first and second openings respectively exposing the first and second pixel electrodes; forming a first photosensitive pattern layer on the pixel-defining layer, the first photosensitive pattern layer comprising a first opening region exposing the first pixel electrode; forming a first multilayer structure on the first pixel electrode and the first photosensitive pattern layer, the first multilayer structure including, in sequence, a first intermediate layer, a first opposite electrode, and a first protective layer; and removing the first photosensitive pattern layer. The first intermediate layer includes an emission layer. After removing the first photosensitive pattern layer, a portion of the first multilayer structure remains on the first pixel electrode.

According to one or more exemplary embodiments, an organic light-emitting diode (OLED) may be more easily formed via a lift-off process that may prevent (or at least reduce) damage to the OLED via an amorphous protective layer. Exemplary embodiments, however, are not limited thereby or thereto.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIGS. 6A, 6B, 6C, 6D, 6E, 6F, 6G, 6H, 6I, 6J, and 6K are cross-sectional views of an organic light-emitting display device at various stages of manufacture, according to one or more exemplary embodiments.

FIGS. 7A, 7B, 7C, 7D, 7E, 7F, and 7G are cross-sectional views of an organic light-emitting display device at various stages of manufacture, according to one or more exemplary embodiments.

DETAILED DESCRIPTION OF THE ILLUSTRATED EMBODIMENTS

Figure 1:
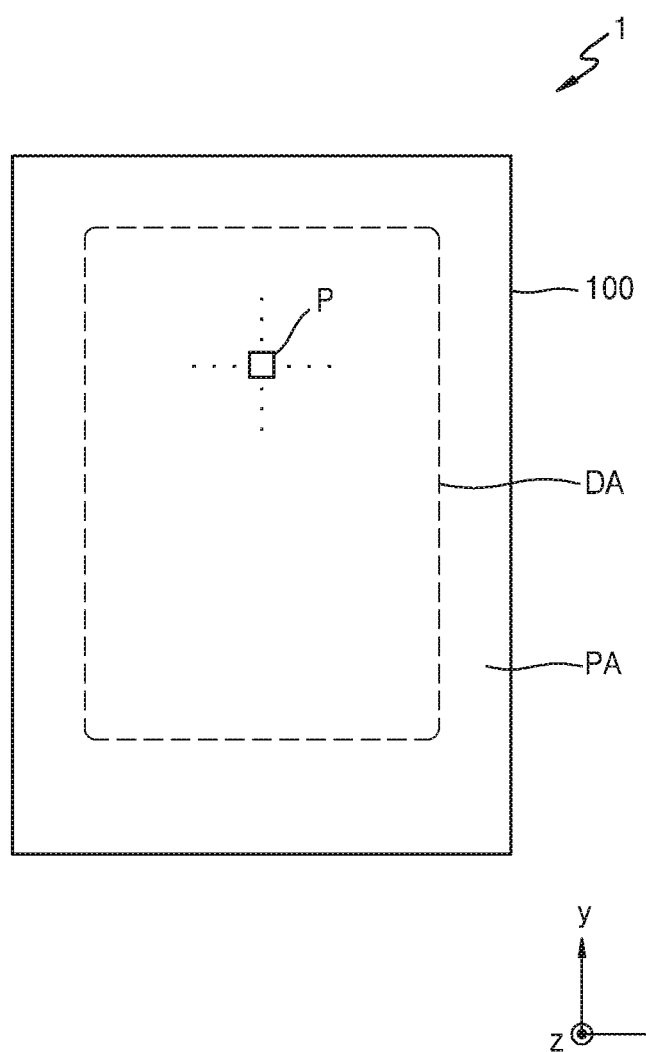
FIG. 1 is a plan view of an organic light-emitting display device, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a plan view of an organic light-emitting display device, according to one or more exemplary embodiments.

Referring to FIG. 1, an organic light-emitting display device 1 includes a substrate 100. The substrate 100 includes a display area DA and a peripheral area PA outside the display area DA. Pixels (e.g., pixel P) including an organic light-emitting diode (OLED) may be in the display area DA of the substrate 100. The peripheral area PA of the substrate 100 is a region in which an image is not displayed (or produced). Various drivers and wirings transferring an electric signal to be applied to the display area DA may be in the peripheral area PA.

Figure 2A:
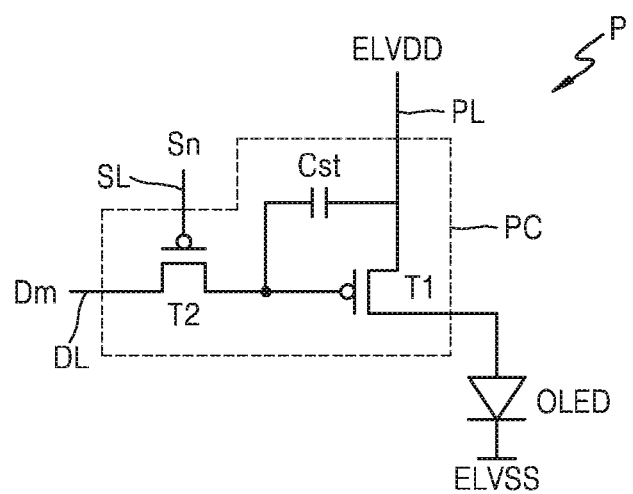
FIG. 2A is an equivalent circuit diagram of a pixel of an organic light-emitting display device, according to one or more exemplary embodiments.
Figure 2B:
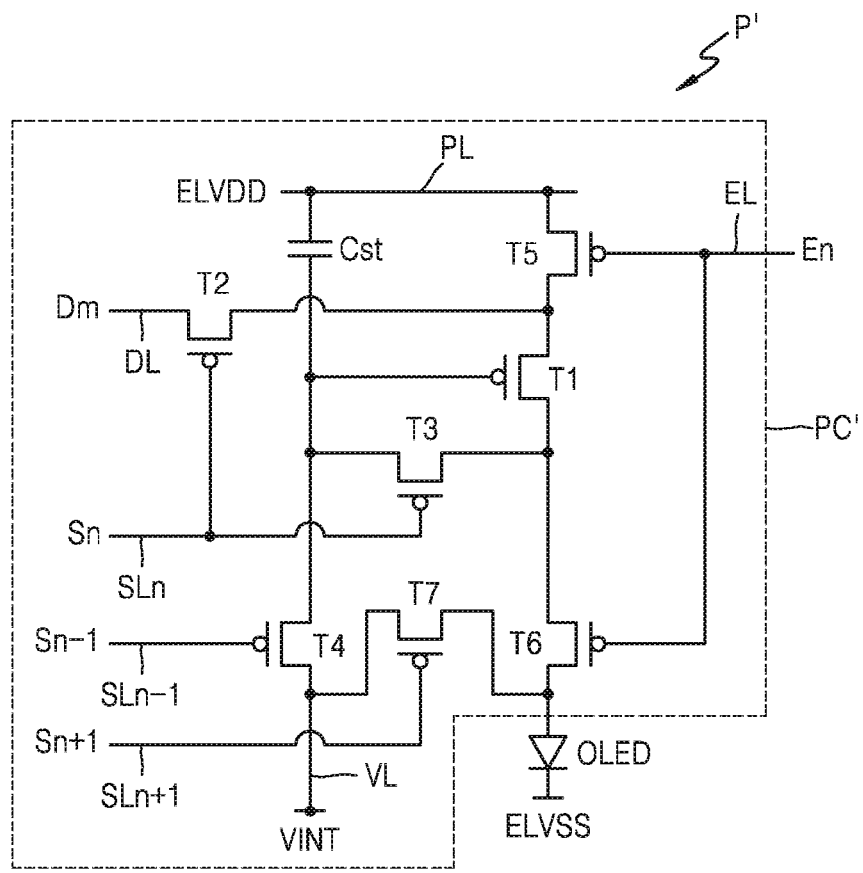
FIG. 2B is an equivalent circuit diagram of a pixel of an organic light-emitting display device, according to one or more exemplary embodiments.

FIGS. 2A and 2B are equivalent circuit diagrams of a pixel of an organic light-emitting display device, according to one or more exemplary embodiments. It is noted that the pixels P and P' of FIGS. 2A and 2B are representative of the pixels of corresponding organic light emitting display devices.

Referring to FIG. 2A, each pixel P includes a pixel circuit PC connected to a scan line SL and a data line DL, and an OLED connected to the pixel circuit PC. The pixel circuit PC includes a driving thin film transistor (TFT) T1, a switching TFT T2, and a storage capacitor Cst. The switching TFT T2 is connected to the scan line SL and the data line DL, and transfers a data signal Dm input via the data line DL to the driving TFT T1 in response to a scan signal Sn input via the scan line SL. The storage capacitor Cst is connected to the switching TFT T2 and a driving voltage line PL, and stores a voltage corresponding to a difference between a voltage transferred from the switching TFT T2 and a driving voltage ELVDD supplied to the driving voltage line PL. The driving TFT T1 is connected to the driving voltage line PL and the storage capacitor Cst, and may control a driving current flowing through the OLED from the driving voltage line PL in response to the voltage value stored in the storage capacitor Cst. The OLED may emit light having determined brightness using the driving current.

Although an exemplary embodiment in which the pixel P includes two TFTs and one storage capacitor Cst has been described with reference to FIG. 2A, exemplary embodiments are not limited thereto or thereby. For instance, any suitable number of TFTs and storage capacitors may be utilized in association with exemplary embodiments.

For example, referring to FIG. 2B, pixel P' may include a pixel circuit PC' that may include the driving and switching TFTs T1 and T2, a compensation TFT T3, a first initialization TFT T4, a first emission control TFT T5, a second emission control TFT T6, and a second initialization TFT T7. A drain electrode of the driving TFT T1 may be electrically connected to the OLED via the second emission control TFT T6. The driving TFT T1 receives a data signal Dm and supplies the driving current to the OLED according to a switching operation of the switching TFT T2.

A gate electrode of the switching TFT T2 is connected to a first scan line SLn ("n" being a natural number), which may be a "current" scan line. A source electrode of the switching TFT T2 is connected to the data line DL. A drain electrode of the switching TFT T2 may be connected to a source electrode of the driving TFT T1 and connected to the driving voltage line PL via the first emission control TFT T5. The switching TFT T2 is turned-on in response to a first scan signal Sn transferred via the first scan line SLn, and performs a switching operation of transferring a data signal Dm transferred via the data line DL to the source electrode of the driving TFT T1.

A gate electrode of the compensation TFT T3 may be connected to the first scan line SLn. A source electrode of the compensation TFT T3 may be connected to the drain electrode of the driving TFT T1 and connected to a pixel electrode (not shown), e.g., an anode electrode, of the OLED via the second emission control TFT T6. A drain electrode of the compensation TFT T3 may be connected (e.g., simultaneously connected) to one of the electrodes of the storage capacitor Cst, a source electrode of the first initialization TFT T4, and a gate electrode of the driving TFT T1. In this manner, the compensation TFT T3 is turned-on in response to a first scan signal Sn transferred via the first scan line SLn and diode-connects the driving TFT T1 by connecting the gate electrode of the driving TFT T1 to the drain electrode of the driving TFT T1.

A gate electrode of the first initialization TFT T4 may be connected to the second scan line SLn−1, which may be a "previous" scan line. A drain electrode of the first initialization TFT T4 may be connected to an initialization voltage line VL. The source electrode of the first initialization TFT T4 may be connected (e.g., simultaneously connected) to one of the electrodes of the storage capacitor Cst, the drain electrode of the compensation TFT T3, and the gate electrode of the driving TFT T1. The first initialization TFT T4 is turned-on in response to a second scan signal Sn−1 transferred via the second scan line SLn−1, and may perform an initialization operation of initializing a voltage of the gate electrode of the driving TFT T1 by transferring an initialization voltage VINT to the gate electrode of the driving TFT T1.

A gate electrode of the first emission control TFT T5 may be connected to an emission control line EL, and, thereby, configured to receive an emission control signal En. A source electrode of the first emission control TFT T5 may be connected to the driving voltage line PL. A drain electrode of the first emission control TFT T5 may be connected to the source electrode of the driving TFT T1 and the drain electrode of the switching TFT T2.

The gate electrode of the second emission control TFT T6 may be connected to the emission control line EL. A source electrode of the second emission control TFT T6 may be connected to the drain electrode of the driving TFT T1 and the source electrode of the compensation TFT T3. A drain electrode of the second emission control TFT T6 may be electrically connected to the pixel electrode of the OLED. The first emission control TFT T5 and the second emission control TFT T6 are turned-on (e.g., simultaneously turned-on) in response to an emission control signal En transferred via the emission control line EL. In this manner, a driving voltage ELVDD is transferred to the OLED, and the driving current flows through the OLED.

A gate electrode of the second initialization TFT T7 may be connected to a third scan line SLn+1, e.g., a "next" scan line. A source electrode of the second initialization TFT T7 may be connected to the pixel electrode of the OLED. A drain electrode of the second initialization TFT T7 may be connected to the initialization voltage line VL and the drain electrode of the first initialization TFT T4. The second initialization TFT T7 is turned-on in response to a third scan signal Sn+1 transferred via the third scan line SLn+1, and may initialize the pixel electrode of the OLED.

The other electrode of the storage capacitor Cst may be connected to the driving voltage line PL. One of the electrodes of the storage capacitor Cst may be connected (e.g., simultaneously connected) to the gate electrode of the driving TFT T1, the drain electrode of the compensation TFT T3, and the source electrode of the first initialization TFT T4.

An opposite electrode of the OLED, such as a common electrode, is connected to a line transmitting a common power voltage ELVSS. The OLED receives the driving current from the driving TFT T1 and emits light.

It is noted, however, that the pixel circuits PC and PC' of FIGS. 2A and 2B are not limited to the number of shown TFTs and storage capacitors. In this manner, the circuit design of a pixel of an organic light-emitting display device may be variously changed, and, thereby, may include any suitable number of TFTs and/or storage capacitors.

Figure 3:
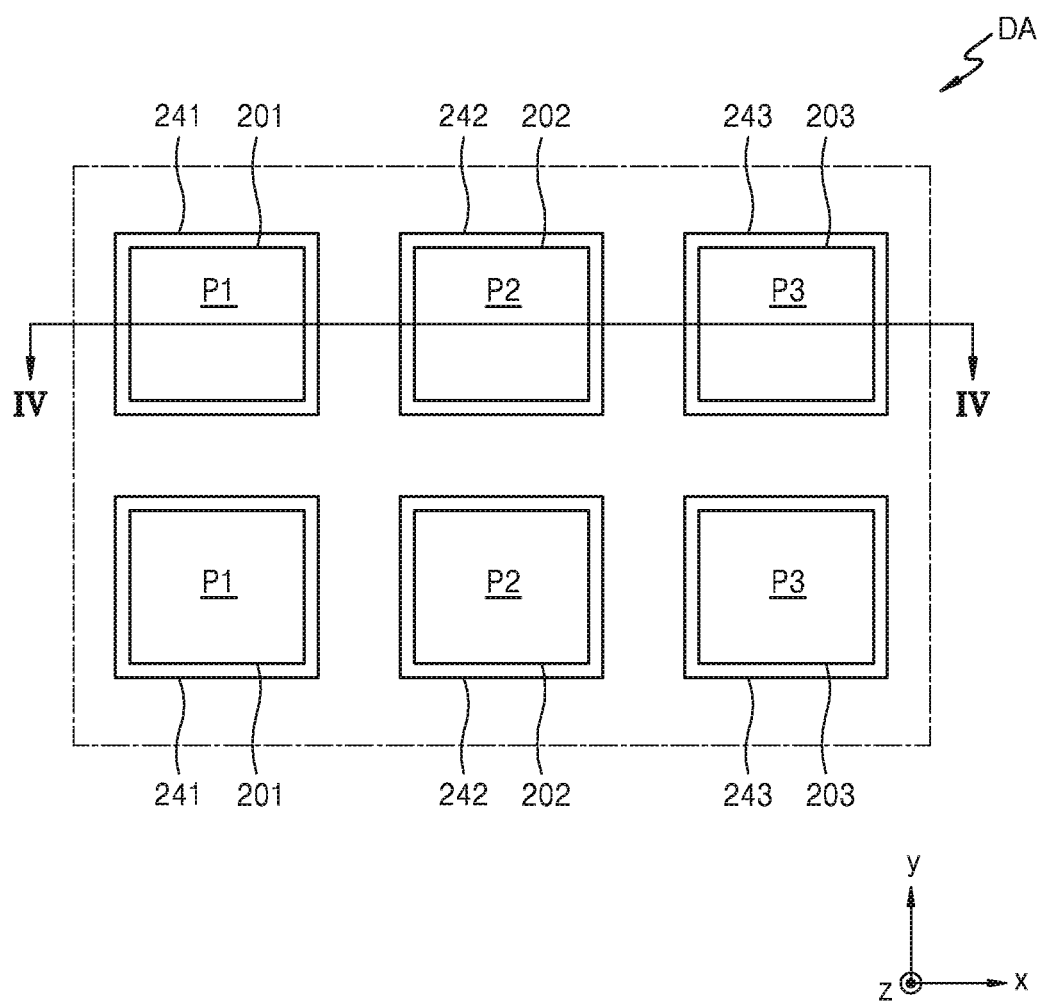
FIG. 3 is a plan view of a portion of a display area of FIG. 1, according to one or more exemplary embodiments.
Figure 4:
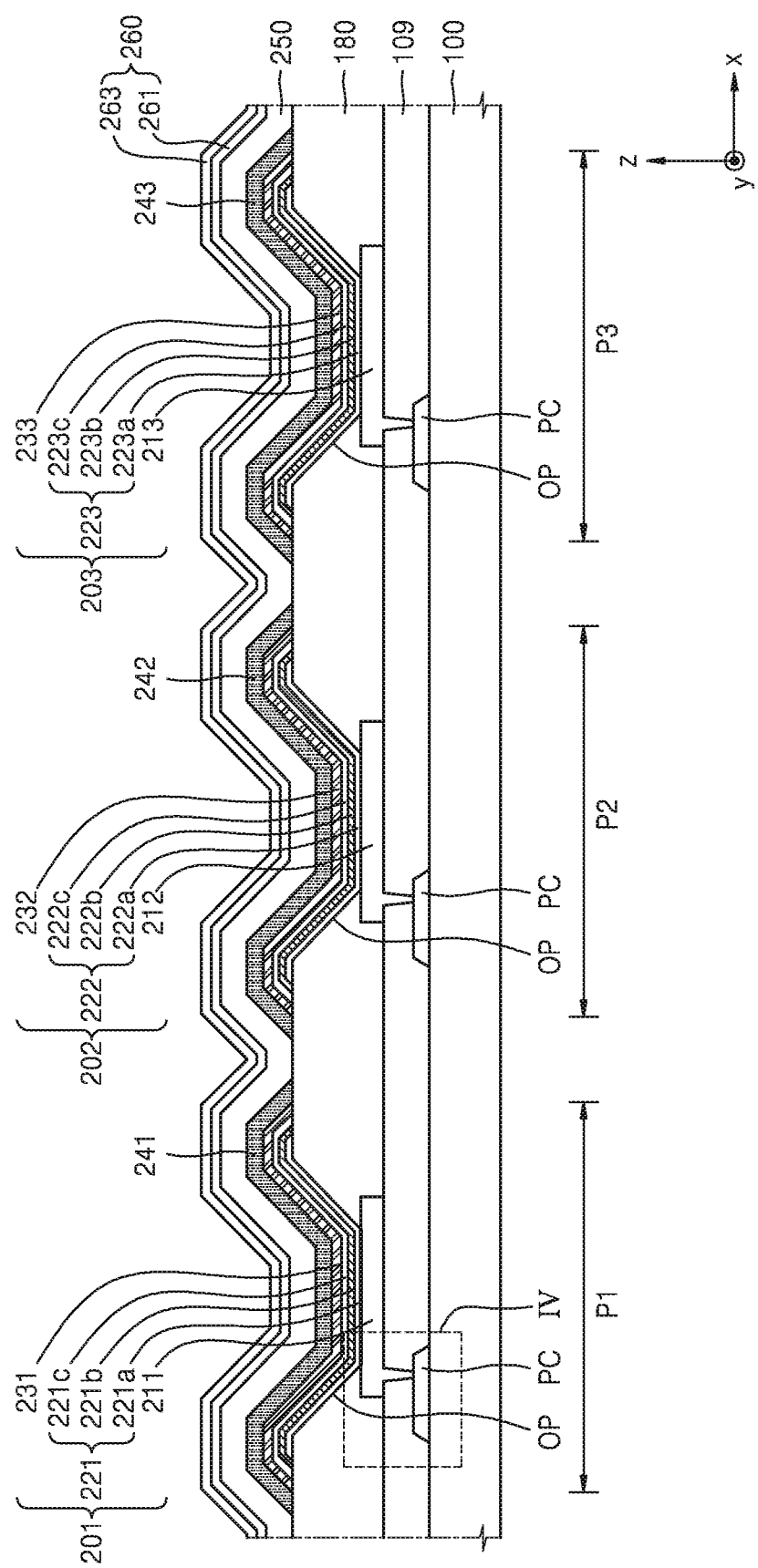
FIG. 4 is a cross-sectional view of an organic light-emitting display device taken along sectional line Iv-Iv of FIG. 3, according to one or more exemplary embodiments.
Figure 5A:
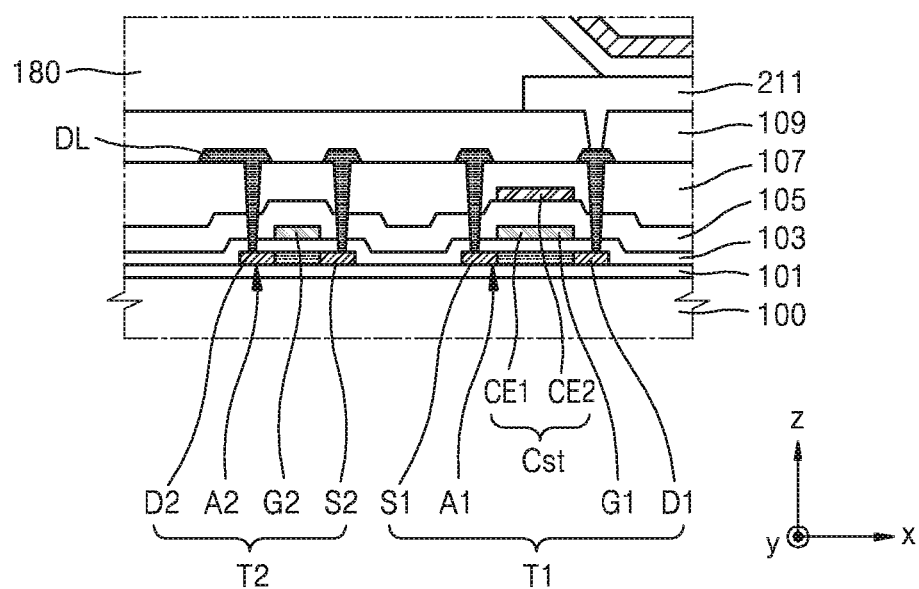
FIG. 5A is a more detailed view of portion IV of FIG. 4, according to one or more exemplary embodiments.
Figure 5B:
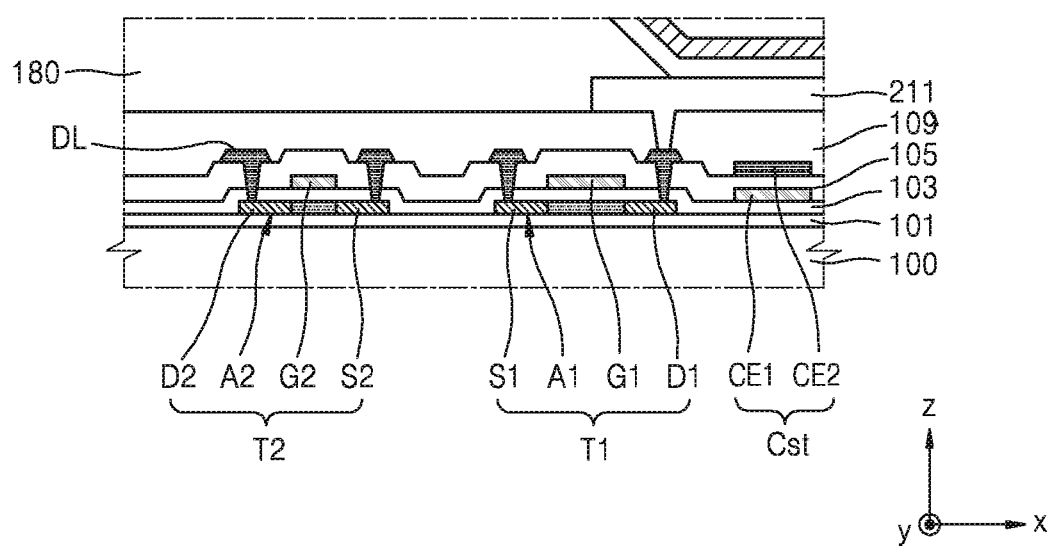
FIG. 5B is a more detailed view of portion IV of FIG. 4, according to one or more exemplary embodiments.

FIG. 3 is a plan view of a portion of a display area of FIG. 1, according to one or more exemplary embodiments. FIG. 4 is a cross-sectional view of an organic light-emitting display device taken along sectional line IV-IV of FIG. 3, according to one or more exemplary embodiments. FIGS. 5A and 5B are more detailed views of portion IV of FIG. 4, according to one or more exemplary embodiments.

Referring to FIGS. 3 and 4, the display area DA includes pixels P1, P2, and P3 configured to emit light of different colors. Hereinafter, for descriptive convenience, pixels of different colors are referred to as a first pixel P1, a second pixel P2, and a third pixel P3. In one or more exemplary embodiments, the first pixel P1 may emit red light, the second pixel P2 may emit green light, and the third pixel P3 may emit blue light. Although three pixels P1 to P3 are shown in the display area DA, exemplary embodiments are not limited thereto or thereby. For instance, in addition to the above-described first to third pixels P1 to P3, a fourth pixel (not shown) emitting white light may be further included. The first to third pixels P1 to P3 respectively include pixel circuits PC, and first to third OLEDs 201 to 203 electrically connected to the pixel circuits PC.

As illustrated in FIG. 5A, the pixel circuit PC may include the driving TFT T1, the switching TFT T2, and the storage capacitor Cst. The driving TFT T1 includes a driving semiconductor layer A1 including a driving source region S1 and a driving drain region D1, and a driving gate electrode G1. The switching TFT T2 includes a switching semiconductor layer A2 including a switching source region S2 and a switching drain region D2, and a switching gate electrode G2. The storage capacitor Cst includes first and second storage plates CE1 and CE2. A buffer layer 101 is between the substrate 100 and the driving and switching semiconductor layers A1 and A2. A gate insulating layer 103 is between the driving and switching semiconductor layers A1 and A2 and the driving and switching gate electrodes G1 and G2. A dielectric layer 105 is between the first and second storage plates CE1 and CE2. An interlayer insulating layer 107 is between the dielectric layer 105 and an insulating layer 109. The insulating layer 109 is below a first pixel electrode 211, e.g., between the interlayer insulating layer 107 and the first pixel electrode 211. The buffer layer 101 and the gate insulating layer 103 may each be a single layer or multiple layers including an inorganic material, such as $SiN_x$ and/or $SiO_x$, the dielectric layer 105 and the interlayer insulating layer 107 may be a single layer or multiple layers including an inorganic material, such as $SiO_x$, $SiN_x$, and/or $Al_2O_3$, and the second insulating layer 109 may include an organic material, such as a general-purpose polymer, e.g., polymethyl methacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof, but exemplary embodiments are not limited thereto or thereby.

As illustrated in FIG. 5A, the first storage plate CE1 and the driving gate electrode G1 are in the same layer and the storage capacitor Cst may overlap the driving TFT T1. That is, the driving gate electrode G1 may also serve as the first storage plate CE1. Referring to FIG. 5B, the storage capacitor Cst may not overlap the driving TFT T1. Although FIGS. 5A and 5B illustrate pixel circuits PC of the first pixel P1, the pixel circuits PC of the other pixels may have the same (or similar) structure, and, as such, duplicative descriptions have been omitted to avoid obscuring exemplary embodiments described herein.

Adverting back to FIG. 4, pixel circuits PC are respectively connected to first to third pixel electrodes 211 to 213 of the first to third OLEDs 201 to 203 via contact holes defined in the insulating layer 109.

The first OLED 201 includes the first pixel electrode 211, a first intermediate layer 221, and a first opposite electrode 231. Each of the first pixel electrode 211, the first intermediate layer 221, and the first opposite electrode 231 has an island type pattern. The first intermediate layer 221 may include a red emission layer 221b, and may further include first and second functional layers 221a and 221c above or below the red emission layer 221b. The first functional layer 221a may include a hole injection layer (HIL) and/or a hole transport layer (HTL), and the second functional layer 221c may include an electron transport layer (ETL) and/or an electron injection layer (EIL). The first intermediate layer 221 may selectively include the first and/or second functional layers 221a and 221c.

The second OLED 202 includes the second pixel electrode 212, a second intermediate layer 222, and a second opposite electrode 232. Each of the second pixel electrode 212, the second intermediate layer 222, and the second opposite electrode 232 has an island type pattern. The second intermediate layer 222 may include a green emission layer 222b, and may further include first and second functional layers 222a and 222c above or below the green emission layer 222b. The first functional layer 222a may include an HIL and/or an HTL, and the second functional layer 222c may include an ETL and/or an EIL. The second intermediate layer 222 may selectively include the first and/or second functional layers 222a and 222c.

The third OLED 203 includes the third pixel electrode 213, a third intermediate layer 223, and a third opposite electrode 233. Each of the third pixel electrode 213, the third intermediate layer 223, and the third opposite electrode 233 has an island type pattern. The third intermediate layer 223 may include a blue emission layer 223b, and may further include first and second functional layers 223a and 223c above or below the blue emission layer 223b. The first functional layer 223a may include an HIL and/or an HTL, and the second functional layer 223c may include an ETL and/or an EIL. The third intermediate layer 223 may selectively include the first and/or second functional layers 223a and 223c.

The first to third pixel electrodes 211 to 213 may be reflective electrodes or optically clear electrodes. When the first to third pixel electrodes 211 to 213 are reflective electrodes, they may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. It is also contemplated that the first to third pixel electrodes 211 to 213 may include the reflective layer and a transparent conductive oxide (TCO) layer above and/or below the reflective layer. When the first to third pixel electrodes 211 to 213 are optically clear electrodes, they may include one or more TCO layers. It is also contemplated that the first to third pixel electrodes 211 to 213 may be metallic thin films including Ag or an Ag alloy, or may be layers including TCO layers above the metallic thin films. For instance, the first to third pixel electrodes 211 to 213 may include three layers of ITO/Ag/ITO sequentially having thicknesses of about 70 Å/850 Å/50 Å; however, exemplary embodiments are not limited thereto or thereby.

The first to third opposite electrodes 231 to 233 may be reflective electrodes or optically clear electrodes. The first to third opposite electrodes 231 to 233 may be metallic thin films or metallic thick films including at least one of Ag, Mg, Al, ytterbium (Yb), calcium (Ca), lithium (Li), and Au. For example, the first to third opposite electrodes 231 to 233 may be a single layer or multiple layers including at least one of Ag, Mg, Al, Yb, Ca, lithium fluoride (LiF)/Ca, LiF/Al, Al, and Au. In one or more exemplary embodiments, the first to third opposite electrodes 231 to 233 may include a metallic thin film including Ag and Mg, and Ag content may be greater than Mg content.

The first to third opposite electrodes 231 to 233 including the above materials may be formed as optically clear electrodes by making thicknesses of the materials relatively thin, or formed as reflective electrodes by making thicknesses of the materials relatively thick. For example, the first to third opposite electrodes 231 to 233 may be used as optically clear electrodes by forming metal including Ag and Mg to a thickness of about 10 to 15 Å, or may be used as reflective electrodes by forming metal including Ag and Mg to a thickness to about 50 nm or more; however, exemplary embodiments are not limited thereto or thereby.

The first to third intermediate layers 221 to 223 and the first to third opposite electrodes 231 to 233 may be manufactured via a lift-off process. For example, a lift-off process may be individually performed for each of the first to third pixels P1 to P3, and a photoresist may be used for the lift-off process(es). When a material included in the photoresist, such as, for example, propylene glycol monomethyl ether acetate (PGMEA), or tetramethylammonium hydroxide (TMAH) included in a developer used for the photoresist penetrates into the OLED, the material may damage or deteriorate the OLED. To prevent or at least reduce the penetration of such materials, first to third protective layers 241 to 243 provided above the first to third OLEDs 201 to 203, and respectively cover the first to third OLEDs 201 to 203.

According to one or more exemplary embodiments, the first to third protective layers 241 to 243 may include amorphous conductive materials. The amorphous conductive materials may include an amorphous oxide. The amorphous oxide may include an amorphous conductive oxide, such as an amorphous transparent conductive oxide (amorphous TCO) and a transparent amorphous oxide semiconductor (TAOS).

The amorphous TCO may include, for example, amorphous indium-tin-oxide (ITO), amorphous indium-tin oxide nitride (ITON), amorphous indium-zinc-oxide (IZO), amorphous indium-zinc oxide nitride (IZON), amorphous indium-zinc tin oxide (IZTO), amorphous aluminum zinc oxide (AZO), etc. A TAOS may include an oxide including at least one of In, gallium (Ga), tin (Sn), zirconium (Zr), vanadium (V), hafnium (Hf), cadmium (Cd), germanium (Ge), and zinc (Zn). For example, the TAOS may include indium gallium zinc oxide (IGZO), indium-tin-zinc oxide (ITZO), etc.

The first to third protective layers 241 to 243 may be a single layer or multiple layers including the above-described amorphous material. For example, the first to third protective layers 241 to 243 may have a minimum thickness of about 10 Å. For example, the first to third protective layers 241 to 243 may have a thickness of about 100 to 300 Å by taking into account the above-described protection and conductivity. If the first to third protective layers 241 to 243 have a thickness less than the minimum thickness of about 10 Å, the first to third OLEDs 201 to 203 may be damaged during the lift-off process(es).

According to one or more exemplary embodiments, the first to third protective layers 241 to 243 respectively correspond to the first to third pixels P1 to P3, have an island type pattern, and are spaced apart from each other. Each of the first to third protective layers 241 to 243 extends in a horizontal direction (e.g., an x-axis direction) and has a width greater than the widths of the first to third opposite electrodes 231 to 233 disposed therebelow. The end of each of the first to third protective layers 241 to 243 may directly contact a pixel-defining layer 180 beyond the end of the first to third opposite electrodes 231 to 233.

A connection layer 250 is integrally formed with and covers the first to third protective layers 241 to 243. The connection layer 250 electrically connects the first to third opposite electrodes 231 to 233, each of which has an island type pattern. As described above, when the first to third protective layers 241 to 243 include a conductive material, the connection layer 250 may electrically connect the first to third opposite electrodes 231 to 233 by contacting the first to third protective layers 241 to 243.

In one or more exemplary embodiments, the connection layer 250 includes a conductive material. For instance, when the first to third pixel electrodes 211 to 213 are reflective electrodes and the first to third opposite electrodes 231 to 233 are optically clear electrodes (e.g., a top-emission type OLED), the connection layer 250 may include a TCO. As another example, when the first to third pixel electrodes 211 to 213 are optically clear electrodes and the first to third opposite electrodes 231 to 233 are reflective electrodes (e.g., a bottom-emission type OLED), the any suitable material for the connection layer 250 may be utilized, such as a TCO and/or metal.

A encapsulation layer 260 may be above (e.g., on) the connection layer 250. The encapsulation layer 260 may include at least one organic layer 261 and at least one inorganic layer 263. The organic layer 261 may include a polymer-based material, such as PMMA, polycarbonate (PC), PS, an acryl-based resin, an epoxy-based resin, polyimide, and polyethylene. The inorganic layer 263 may include AlN, $Al_2O_3$, TiN, $TiO_2$, SiON, $SiN_x$, and $SiO_x$. Although FIG. 4 illustrates the organic layer 261 being arranged below and the inorganic layer 263 being arranged above, exemplary embodiments are not limited thereto or thereby. For instance, the locations of the organic layer 261 and the inorganic layer 263 are changeable, and a stacking sequence, the number of layers, etc., may be variously changed. A manufacturing process of an organic light-emitting display device including the first to third protective layers 241 to 243 will be described in more detail in association with FIGS. 6A to 6K.

FIGS. 6A to 6K are cross-sectional views of an organic light-emitting display device at various stages of manufacture, according to one or more exemplary embodiments.

Referring to FIG. 6A, pixel circuits PC and the first to third pixel electrodes 211 to 213 electrically connected to the pixel circuits PC, respectively, are formed above the substrate 100. The pixel-defining layer 180 including openings OP respectively exposing the first to third pixel electrodes 211 to 213 is formed.

The substrate 100 may include various materials, such as a glass material or a plastic material including polyethylene terephthalate (PET), polyethylene naphthalate (PEN), polyimide (PI), etc. When the substrate 100 includes a plastic material, the flexibility of the substrate 100 may improve as compared to a substrate 100 including a glass material. To prevent (or reduce) penetration of impurities, a buffer layer (not shown) may be provided above the substrate 100. The buffer layer may include $SiO_x$ and/or $SiN_x$.

After the pixel circuits PC are formed above the substrate 100, contact holes are formed by patterning an insulating layer 109 covering the pixel circuits PC. The first to third pixel electrodes 211 to 213 are formed by forming a conductive material layer (not shown) and then patterning the conductive material layer. The conductive material layer may include a reflective layer including Mg, Al, Pt, Pd, Au, Ni, Nd, Jr, Cr, or a compound thereof, or a TCO layer above or below the reflective layer. It is also contemplated that the conductive material layer may include a thin film including Ag or an Ag alloy, or include a TCO layer above the thin film. Depending on the conductive material layer, the first to third pixel electrodes 211 to 213 may be reflective electrodes or optically clear electrodes, and a specific configuration thereof has been previously described with reference to FIG. 4.

After formation of the first to third pixel electrodes 211 to 213, the pixel-defining layer 180 is formed by forming an organic insulating layer (not shown) and then patterning the organic insulating layer. The pixel-defining layer 180 includes the openings OP respectively exposing the first to third pixel electrodes 211 to 213. Although exemplary embodiments have been described with the pixel-defining layer 180 defining an organic insulating layer, exemplary embodiments are not limited thereto or thereby. For instance, the pixel-defining layer 180 may include an organic insulating material and an inorganic insulating material, or an inorganic insulating material. To this end, the pixel-defining layer 180 may have a single layered or multi-layered structure of one or more of the above-noted materials.

Figure 6B:
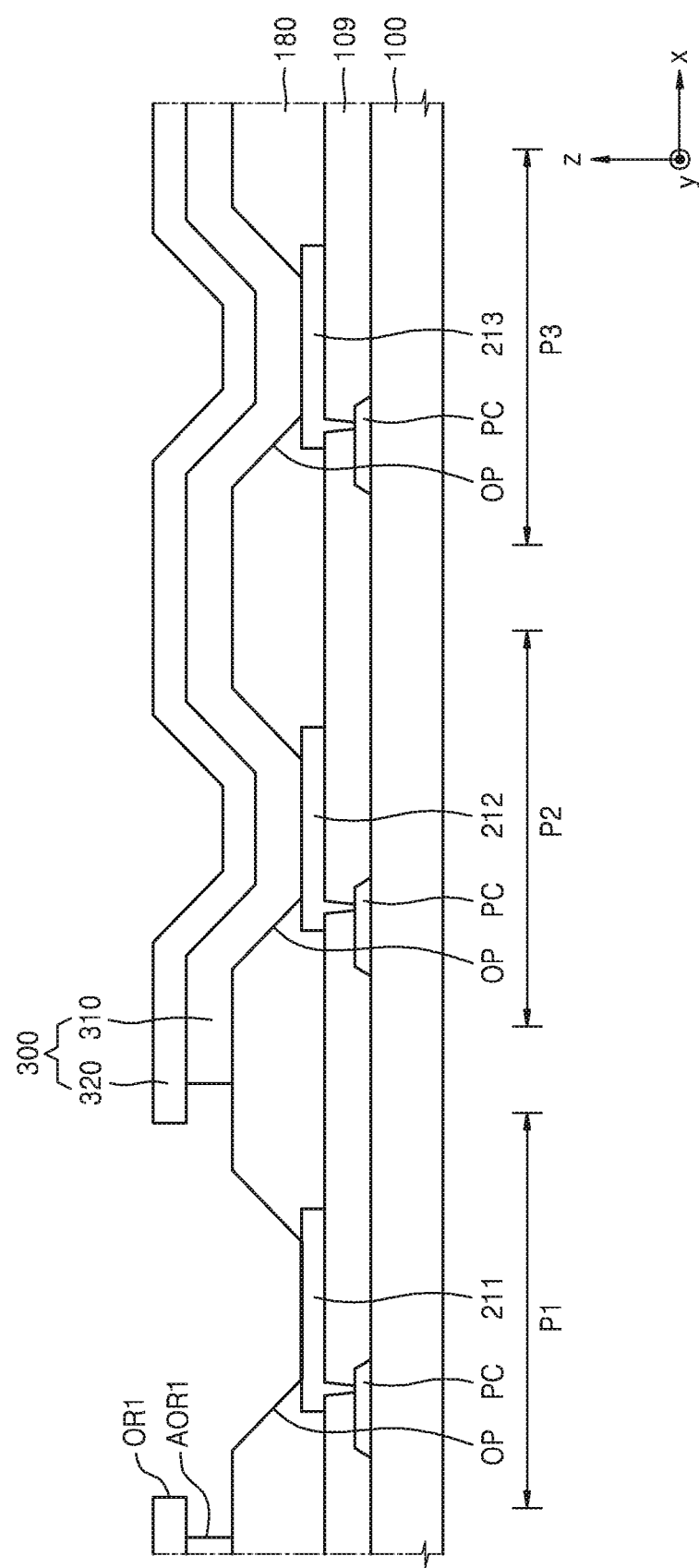

Referring to FIG. 6B, a first masking pattern 300 is formed above the pixel-defining layer 180. The first masking pattern 300 includes a first photosensitive pattern layer 320. The first masking pattern 300 may further include a first auxiliary layer 310 between the first photosensitive pattern layer 320 and the pixel-defining layer 180. According to one or more exemplary embodiments, the first masking pattern 300 may be formed as described below.

A non-photosensitive organic layer (not shown) is formed above the substrate 100 including the pixel-defining layer 180, and a photoresist layer (not shown) is formed thereabove. The non-photosensitive organic layer may include a fluorine-based material, for example, but exemplary embodiments are not limited thereto or thereby. The photoresist layer may include a positive photosensitive material.

After formation of the photoresist layer, the first photosensitive pattern layer 320 having a first opening region OR1 is formed by exposing and developing a partial region of the photoresist layer that corresponds to the first pixel P1. Next, a first auxiliary opening region AOR1 is formed by etching the non-photosensitive organic layer exposed via the first opening region OR1. The first auxiliary opening region AOR1 of the first auxiliary layer 310 is larger than the first opening region OR1 via etching.

Figure 6C:
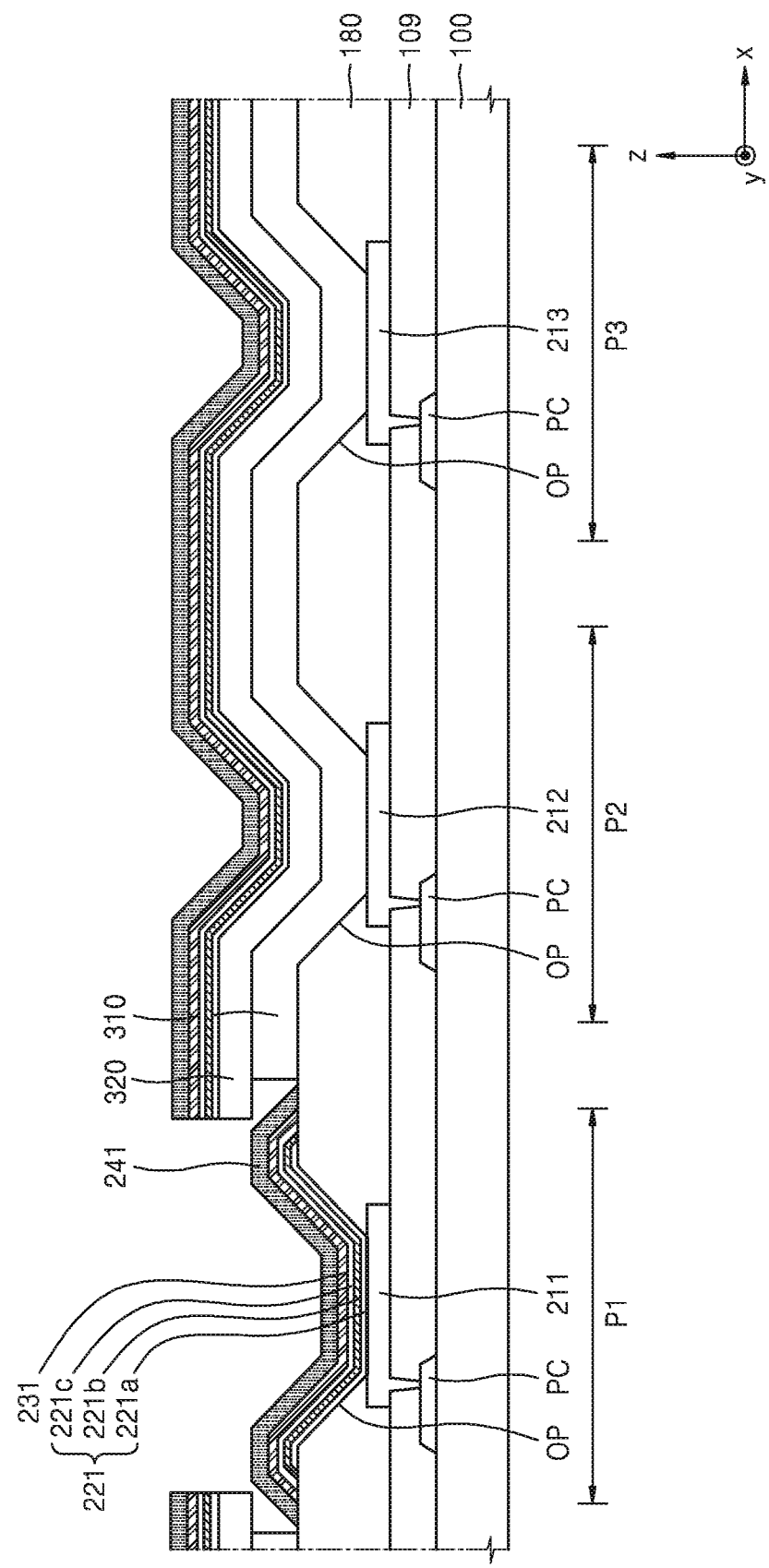

Referring to FIG. 6C, the first intermediate layer 221, the first opposite electrode 231, and the first protective layers 241 are sequentially formed above the substrate 100 including the first masking pattern 300. The first intermediate layer 221 may include, for example, the red emission layer 221b and include the first and second functional layers 221a and 221c above and/or below the emission layer 221b.

The first intermediate layer 221 and the first opposite electrode 231 may be formed by a thermal evaporation method. Deposition materials for forming the first intermediate layer 221 and the first opposite electrode 231 may move toward the substrate 100 in a direction perpendicular to the substrate 100 and an oblique direction with respect to the substrate 100. In this manner, the end of the first intermediate layer 221 and the end of the first opposite electrode 231 may extend to a space below the first photosensitive pattern layer 320 without contacting the first auxiliary layer 310. Since the deposition materials are deposited in the oblique direction, the ends of the first intermediate layer 221 and the first opposite electrode 231 may have a forward tapered shape. Materials of the first intermediate layer 221 and the first opposite electrode 231 have been previously described with reference to FIG. 4, and, as such, duplicative descriptions have been omitted to avoid obscuring exemplary embodiments.

The first protective layer 241 includes an amorphous material. For example, the first to third protective layers 241 to 243 may include an amorphous oxide, such as an amorphous conductive oxide. The amorphous conductive oxide may include a TCO, a TAOS, etc. Various exemplary embodiments have been provided for the first protective layer 241 with reference to FIG. 4, and, as such, duplicative descriptions have been omitted to avoid obscuring exemplary embodiments.

Figure 6D:
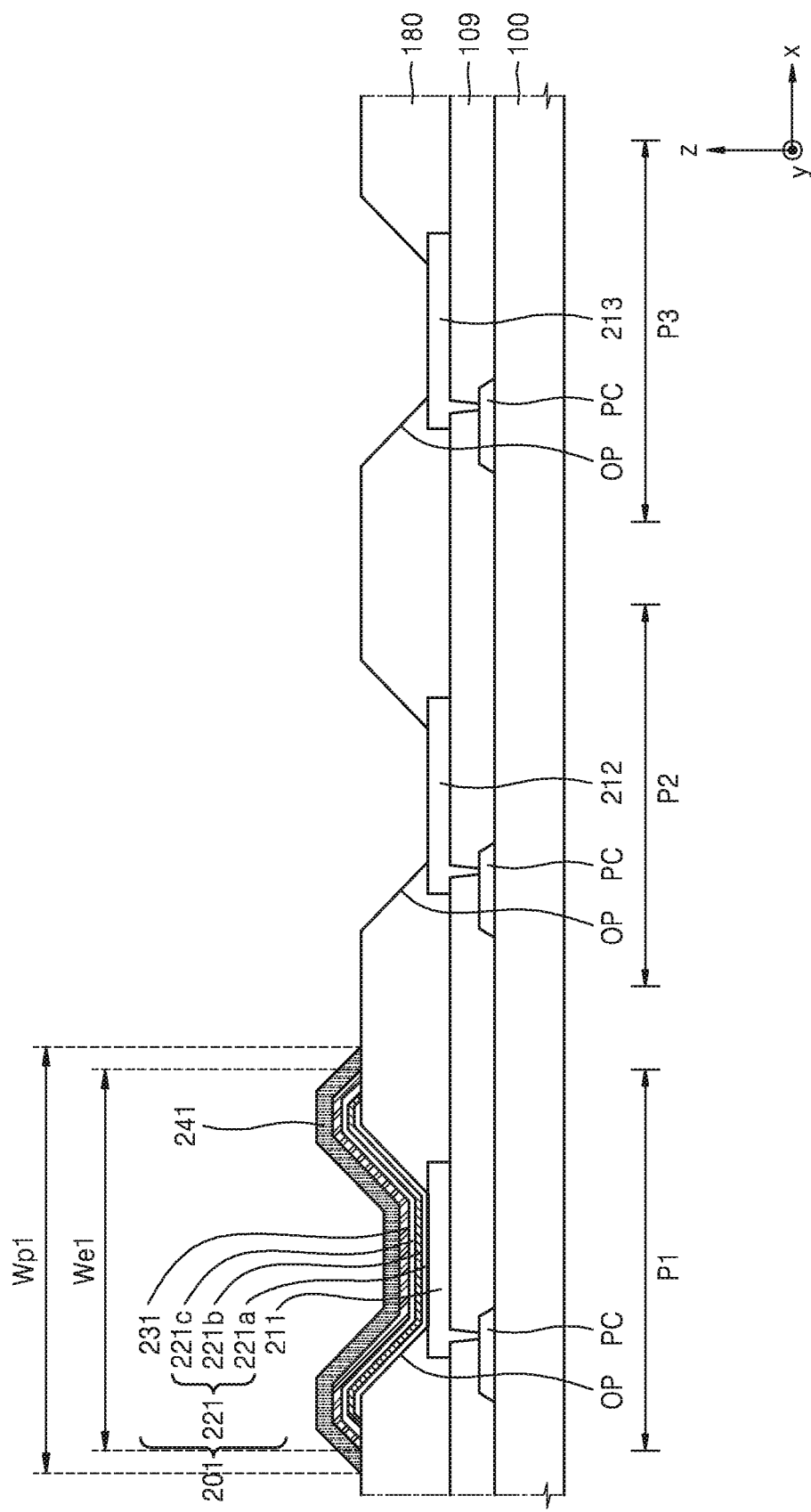

The first protective layer 241 may be formed by a sputtering method, for example. Materials for forming the first protective layer 241 may move toward the substrate 100 in a direction perpendicular to the substrate 100 and an oblique direction with respect to the substrate 100. In this manner, the end of the first protective layer 241 may extend to a space below the first photosensitive pattern layer 320 without contacting the first auxiliary layer 310. As illustrated in FIG. 6D, the first protective layer 241 may have a width Wp1 that is greater than a width We1 of the first opposite electrode 231. As such, the first protective layer 241 may completely cover the first opposite electrode 231. The end of the first protective layer 241 may directly contact the pixel-defining layer 180 and have a forward tapered shape.

With continued reference to FIG. 6D, the first masking pattern 300 is removed via a lift-off process. In one or more exemplary embodiments, when the first auxiliary layer 310 includes a fluorine-based material, the first auxiliary layer 310 may be removed using a fluorine-based solvent. When the first auxiliary layer 310 is removed, the first photosensitive pattern layer 320 above the first auxiliary layer 310, as well as the first intermediate layer 221, the first opposite electrode 231, and the first protective layer 241 stacked above the first photosensitive pattern layer 320 are removed together with the first auxiliary layer 310. Also, the island-type patterned first intermediate layer 221, the first opposite electrode 231, and the first protective layer 241 remain in the first pixel P1.

According to one or more exemplary embodiments, the first protective layer 241 may protect the first OLED 201 during the lift-off process. For example, the first protective layer 241 may prevent (or reduce) a material included in a solvent removing the first auxiliary layer 310 from penetrating into the first opposite electrode 231 and the first intermediate layer 221 below the first opposite electrode 231. The first protection layer 241 may also serve to protect the first opposite electrode 231 and the first intermediate layer 221 from damage during the lift-off process of the first masking pattern 300.

Figure 6E:
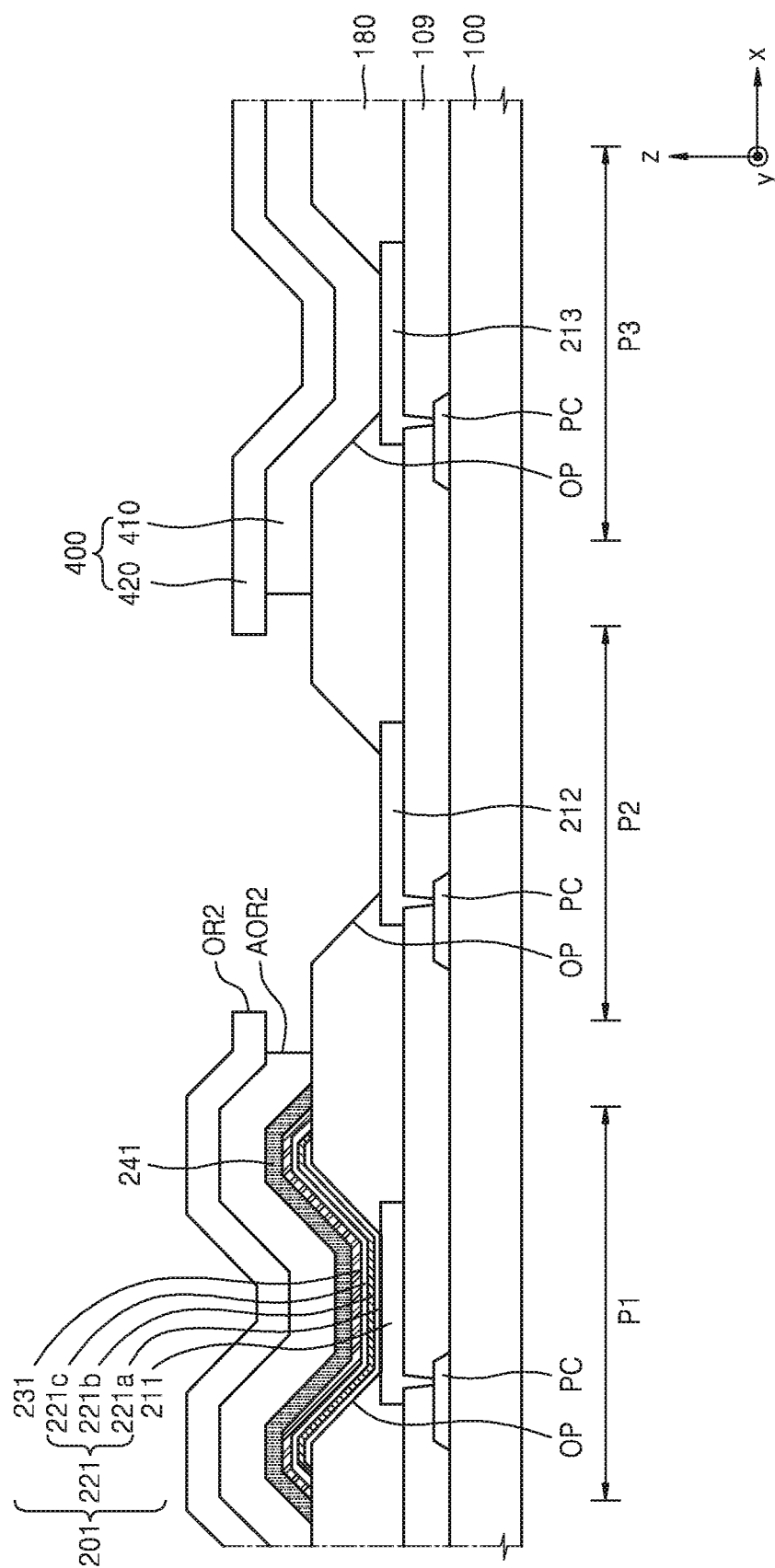

Referring to FIG. 6E, a second masking pattern 400 is formed above the first protective layer 241 and the pixel-defining layer 180. The second masking pattern 400 includes a second photosensitive pattern layer 420. The second masking pattern 400 may further include a second auxiliary layer 410 between the second photosensitive pattern layer 420 and the pixel-defining layer 180. The second masking pattern 400 may be formed by the same method as the method of forming the first masking pattern 300.

For example, a non-photosensitive organic layer (not shown) is formed above the substrate 100 including the first OLED 201 and the first protective layer 241. A photoresist layer (not shown) is formed on the non-photosensitive organic layer. In one or more exemplary embodiments, the non-photosensitive organic layer may include a fluorine-based material, for example. The photoresist layer may include a positive photosensitive material. After formation of the photoresist layer, the second photosensitive pattern layer 420 having a second opening region OR2 is formed by exposing and developing a partial region of the photoresist layer that corresponds to the second pixel P2. Next, the second auxiliary layer 410 having a second auxiliary opening region AOR2 that is larger than the second opening region OR2 is formed by etching the second auxiliary layer 410 exposed via the second opening region OR2 in the non-photosensitive organic layer.

Figure 6F:
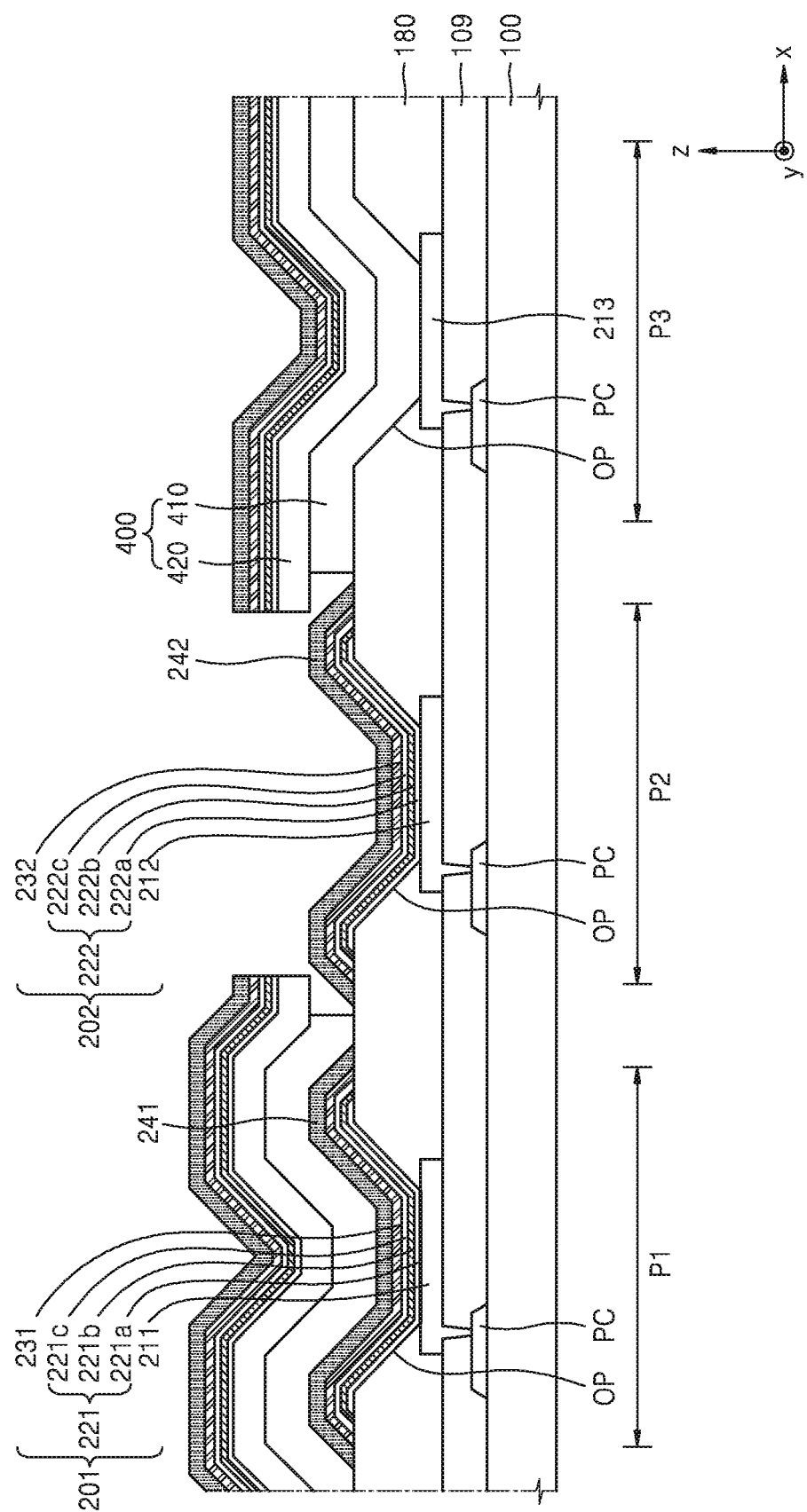

Adverting to FIG. 6F, the second intermediate layer 222, the second opposite electrode 232, and the amorphous second protective layer 242 are sequentially formed above the substrate 100 including the second masking pattern 400. The second intermediate layer 222 and the second opposite electrode 232 may be formed by a thermal evaporation method, and the amorphous second protective layer 242 may be formed by a sputtering method. Since the materials of the second intermediate layer 222 and the second opposite electrode 232, and the material of the amorphous second protective layer 242 are the same as those described with reference to FIG. 4, duplicative descriptions are omitted to avoid obscuring exemplary embodiments.

Figure 6G:
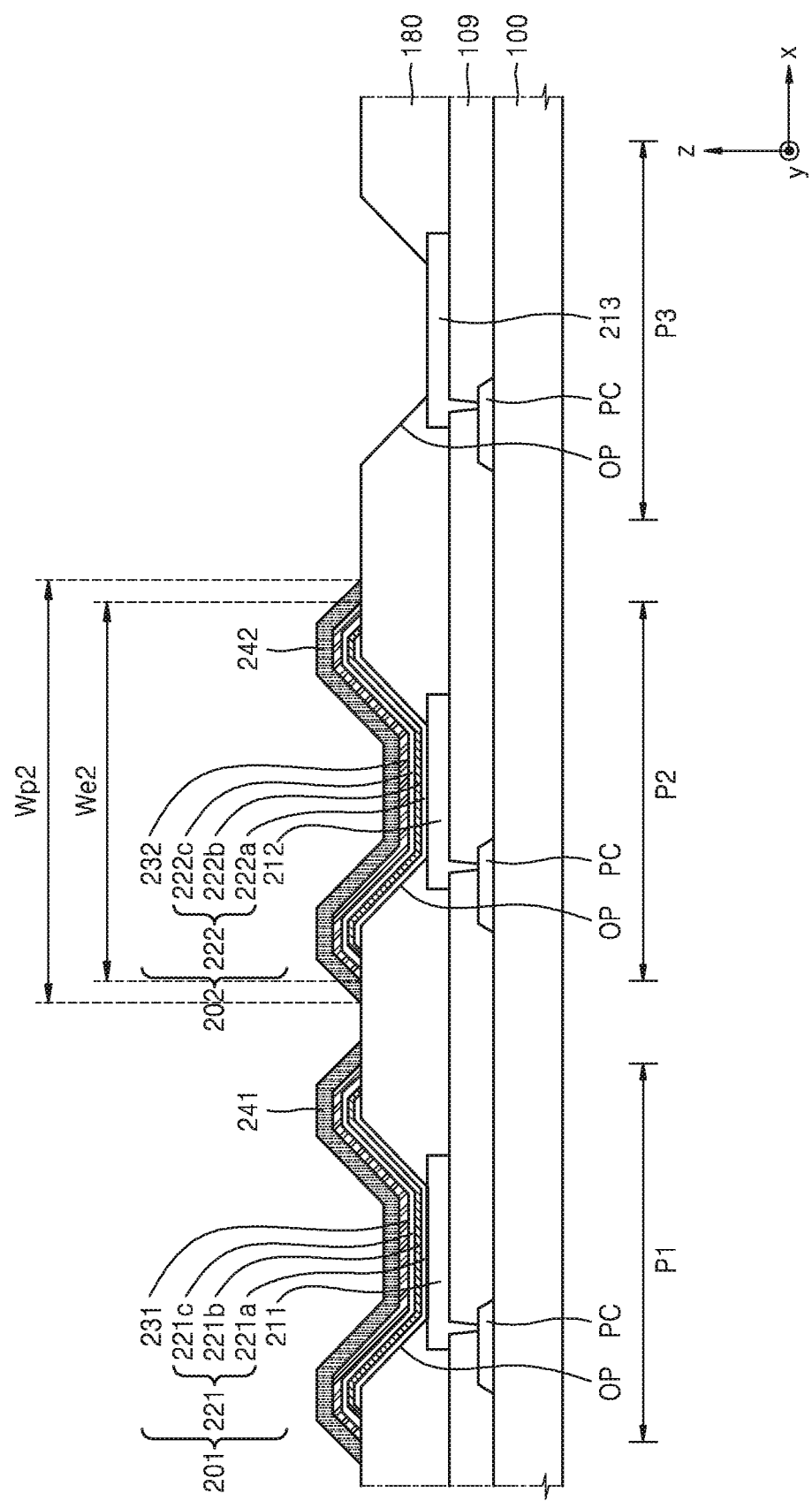

Deposition materials of the second intermediate layer 222, the second opposite electrode 232, and the amorphous second protective layer 242 may move toward the substrate 100 in a direction perpendicular to the substrate 100 and an oblique direction with respect to the substrate 100. In this manner, the ends of the second intermediate layer 222, the second opposite electrode 232, and the amorphous second protective layer 242 may extend to a space below the second photosensitive pattern layer 420 without contacting the second auxiliary layer 410. As illustrated in FIG. 6G, the amorphous second protective layer 242 may have a width Wp2 greater than a width We2 of the second opposite electrode 232. As such, the amorphous second protective layer 242 may completely cover the second opposite electrode 232. The end of the amorphous second protective layer 242 may directly contact the pixel-defining layer 180 while having a forward tapered shape.

Referring to FIG. 6G, the second masking pattern 400 is removed via a lift-off process. In one or more exemplary embodiments, when the second auxiliary layer 410 includes a fluorine-based material, the second auxiliary layer 410 may be removed using a fluorine-based solvent. When the second auxiliary layer 410 is removed, the second photosensitive pattern layer 420 above the second auxiliary layer 410, as well as the second intermediate layer 222, the second opposite electrode 232, and the amorphous second protective layer 242 stacked above the second photosensitive pattern layer 420 are removed with the second auxiliary layer 410. Also, the island-type patterned second intermediate layer 222, the second opposite electrode 232, and the amorphous second protective layer 242 remain as part of the second pixel P2.

The first protective layer 241 may protect the first OLED 201 during the process described with reference to FIGS. 6E to 6G. For example, the first protective layer 241 may prevent materials, such as PGMEA included in the second masking pattern 400 above the first OLED 201 or TMAH used when developing the second masking pattern 400 from penetrating into the first OLED 201. Also, the first and second protective layers 241 and 242 may protect the first and second OLEDs 201 and 202 during a lift-off process. For example, the first and second protective layers 241 and 242 may prevent (or reduce) a material included in a solvent removing the second auxiliary layer 410 from penetrating into the first and second OLEDs 201 and 202. To this end, the first and second protective layers 241 and 242 may prevent (or reduce) the first and second OLEDs 201 and 202 from being damaged by another material.

Referring to FIG. 6H, a third masking pattern 500 including a third photosensitive pattern layer 520 is formed above the first and second protective layers 241 and 242 and the pixel-defining layer 180. The third masking pattern 500 may further include a third auxiliary layer 510 between the third photosensitive pattern layer 520 and the pixel-defining layer 180. The third masking pattern 500 may be formed by the same method as the method of forming the first and second masking patterns 300 and 400.

For example, a non-photosensitive organic layer (not shown) is formed above the substrate 100, a photoresist layer (not shown) is formed thereabove, and then the third photosensitive pattern layer 520 having a third opening region OR3 is formed by exposing and developing the third photosensitive pattern layer 520. Also, the third auxiliary layer 510 having a third auxiliary opening region AOR3 greater than the third opening region OR3 is formed by etching the non-photosensitive organic layer exposed via the third opening region OR3. In one or more exemplary embodiments, the non-sensitive organic layer may include a fluorine-based material, for example. The photoresist layer may include a positive photosensitive material.

Figure 6I:
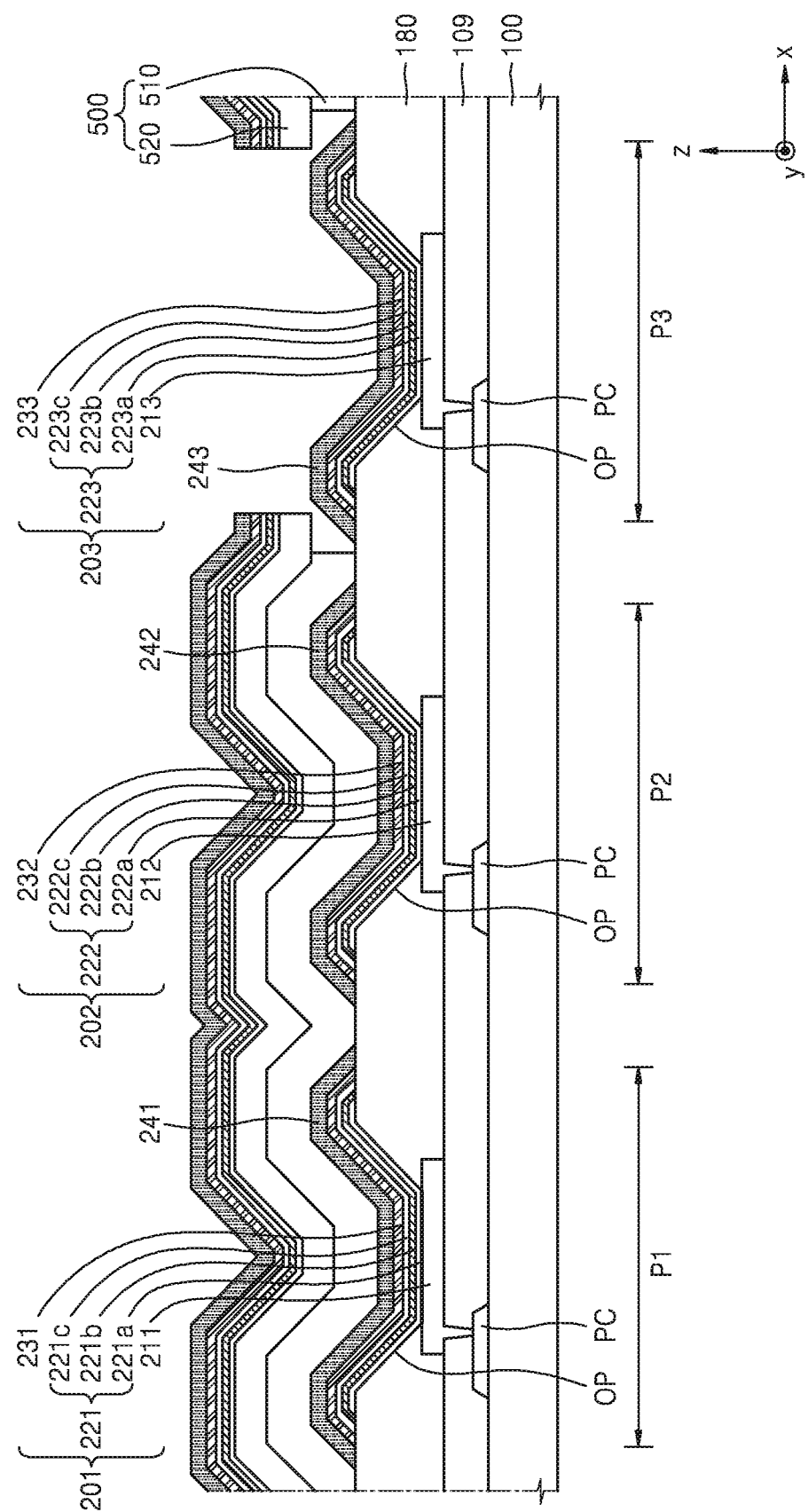

Referring to FIG. 6I, the third intermediate layer 223, the third opposite electrode 233, and the third protective layer 243 are sequentially formed above the substrate 100 including the third masking pattern 500. The third intermediate layer 223 and the third opposite electrode 233 may be formed by a thermal evaporation method, and the amorphous third protective layer 243 may be formed by a sputtering method. Since the materials of the third intermediate layer 223 and the third opposite electrode 233, and the material of the amorphous third protective layer 243 are the same as the materials described with reference to FIG. 4, duplicative descriptions are omitted to avoid obscuring exemplary embodiments.

Figure 6J:
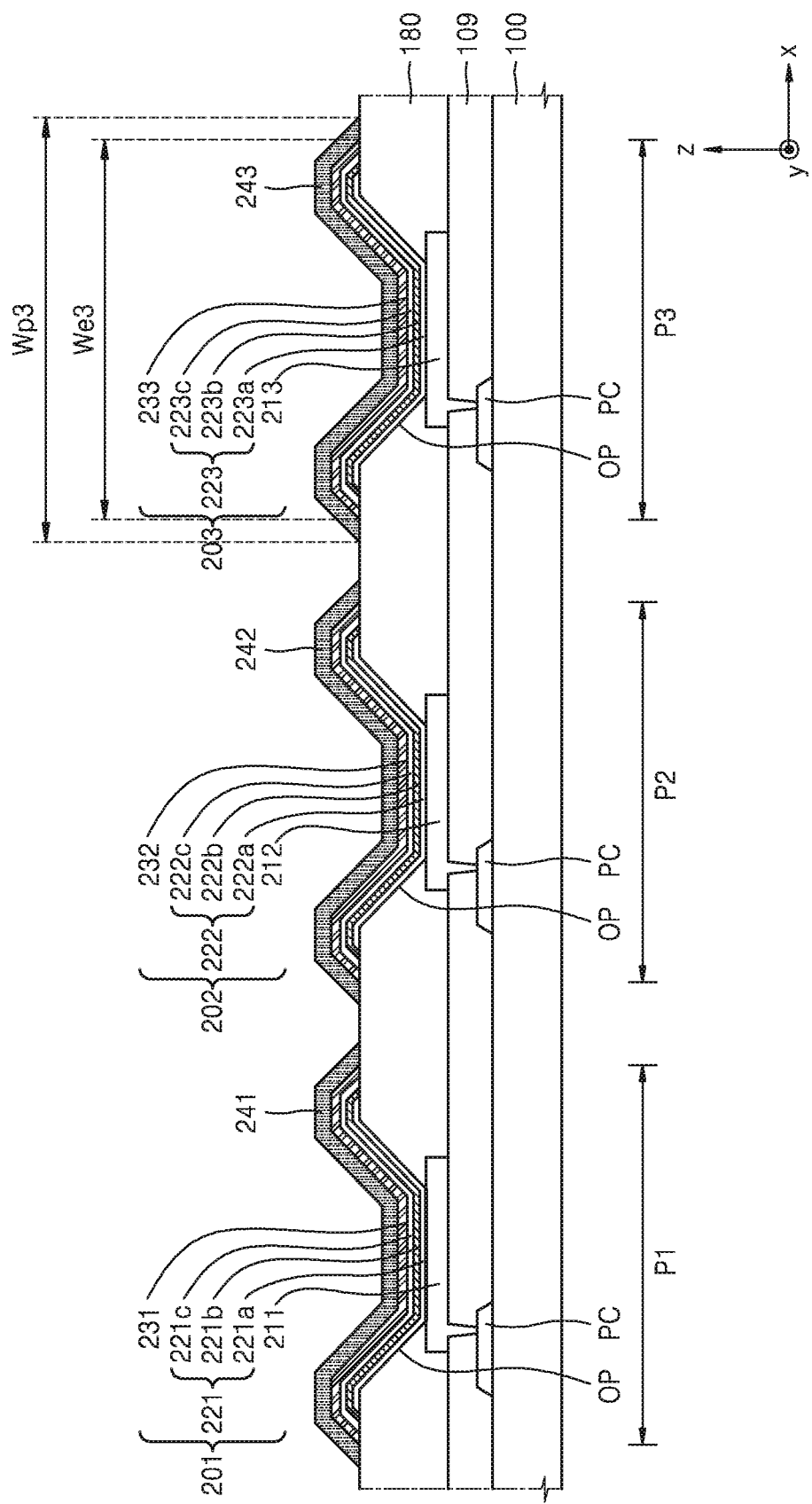

Deposition materials of the third intermediate layer 223, the third opposite electrode 233, and the amorphous third protective layer 243 may move toward the substrate 100 in a direction perpendicular to the substrate 100 and an oblique direction with respect to the substrate 100. In this manner, the ends of the third intermediate layer 223, the third opposite electrode 233, and the amorphous third protective layer 243 may extend to a space below the third photosensitive pattern layer 520 without contacting the third auxiliary layer 510. As illustrated in FIG. 6J, the amorphous third protective layer 243 may have a width Wp3 greater than a width We3 of the third opposite electrode 233. As such, the amorphous third protective layer 243 may completely cover the third opposite electrode 233. The end of the amorphous third protective layer 243 may directly contact the pixel-defining layer 180 while having a forward tapered shape.

With continued reference to FIG. 6J, the third masking pattern 500 is removed via a lift-off process. In one or more exemplary embodiments, when the third auxiliary layer 510 includes a fluorine-based material, the third auxiliary layer 510 may be removed using a fluorine-based solvent. When the third auxiliary layer 510 is removed, the third photosensitive pattern layer 520 above the third auxiliary layer 510, as well as the third intermediate layer 223, the third opposite electrode 233, and the amorphous third protective layer 243 stacked above the third photosensitive pattern layer 520 are also removed. In this manner, the island-type patterned third intermediate layer 223, third opposite electrode 233, and third protective layer 243 remain as part of the third pixel P3.

The first and second protective layers 241 and 242 may protect the first and second OLEDs 201 and 202 during the process described with reference to FIGS. 6H to 6J. For example, the first and second protective layers 241 and 242 may prevent (or reduce) materials, such as PGMEA included in the third masking pattern 500 above the first and second OLEDs 201 and 202 or TMAH used when developing the third masking pattern 500 from penetrating into the first and second OLEDs 201 and 202. Also, the first to third protective layers 241 to 243 may protect the first to third OLEDs 201 to 203 during a lift-off process. For example, the first to third protective layers 241 to 243 may prevent (or reduce) a material included in a solvent removing the third auxiliary layer 510 from penetrating into the first to third OLEDs 201 to 203. It is also contemplated that the first to third protective layers 241 to 243 may prevent (or reduce) damage to the first to third OLEDs 201 to 203 by a material.

Figure 6K:
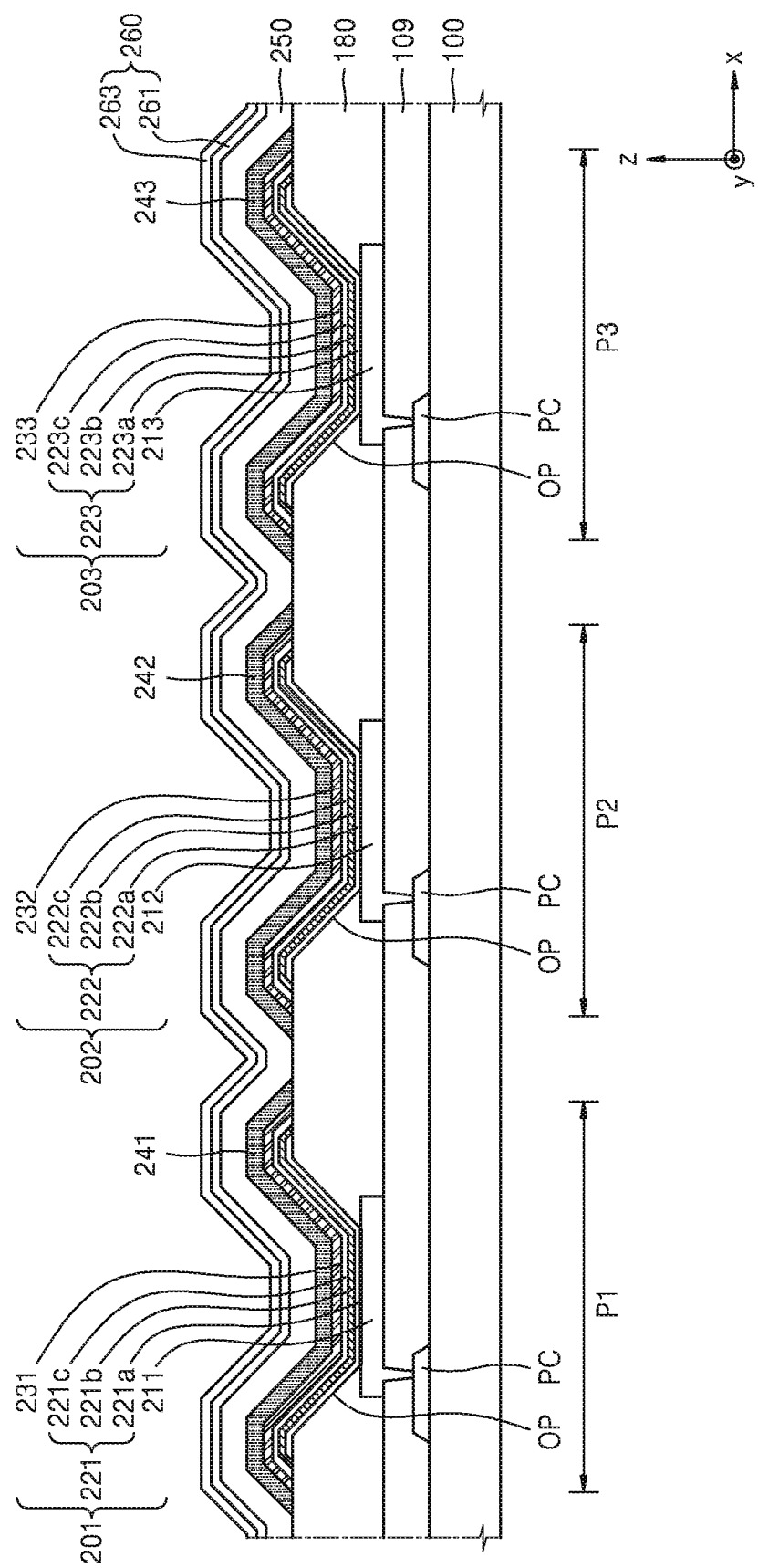

Referring to FIG. 6K, the connection layer 250 is formed above the substrate 100 including the first to third protective layers 241 to 243. The connection layer 250 is integrally formed above the entire (or substantially entire) surface of the substrate 100. In this manner, the connection layer 250 covers all of the first to third pixels P1 to P3. The connection layer 250 includes a conductive material. The material used for the connection layer 250 is the same at the material described with reference to FIG. 4, and, as such, duplicative descriptions have been omitted to avoid obscuring exemplary embodiments.

According to one or more exemplary embodiments, the encapsulation layer 260 may be formed above the connection layer 250. The protection layer 260 may include at least one organic layer 261 and at least one inorganic layer 263. The organic layer 261 may include a polymer-based material. In one or more exemplary embodiments, the organic layer 261 may be formed by depositing a liquid (or vapor) monomer and then curing the deposition material including the monomer using heat or light, such as an ultraviolet ray. The inorganic material 263 may include SiON, $SiN_x$, $SiO_x$, etc. The inorganic layer 263 may be formed by plasma-enhanced chemical vapor deposition (PECVD).

Although exemplary embodiments have been described with the organic layer 261 being arranged below and the inorganic layer 263 being arranged above, exemplary embodiments are not limited thereto or thereby. For instance, the locations of the organic layer 261 and the inorganic layer 263 are changeable, and a stacking sequence, the number of layers, etc., may be variously changed. Further, although exemplary embodiments have been described with reference to FIGS. 6A to 6K as including the first to third masking patterns 300 to 500 respectively including the first to third auxiliary layers 310 to 510, exemplary embodiments are not limited thereto or thereby.

FIGS. 7A to 7G are cross-sectional views of an organic light-emitting display device at various stages of manufacture, according to one or more exemplary embodiments. It is noted that the manufacturing process described in association with FIGS. 6A to 6K is similar to the manufacturing process of FIGS. 7A to 7G, but unlike the manufacturing process of FIGS. 6A to 6K, in which the first to third masking patterns 300 to 500 include the first to third photosensitive pattern layers 320 to 430 and the first to third auxiliary layers 310 to 510, the manufacturing process of FIGS. 7A to 7G includes only first to third photosensitive pattern layers 3201, 4201, and 5201. Accordingly, duplicative descriptions are primarily omitted to avoid obscuring exemplary embodiments.

Figure 7A:
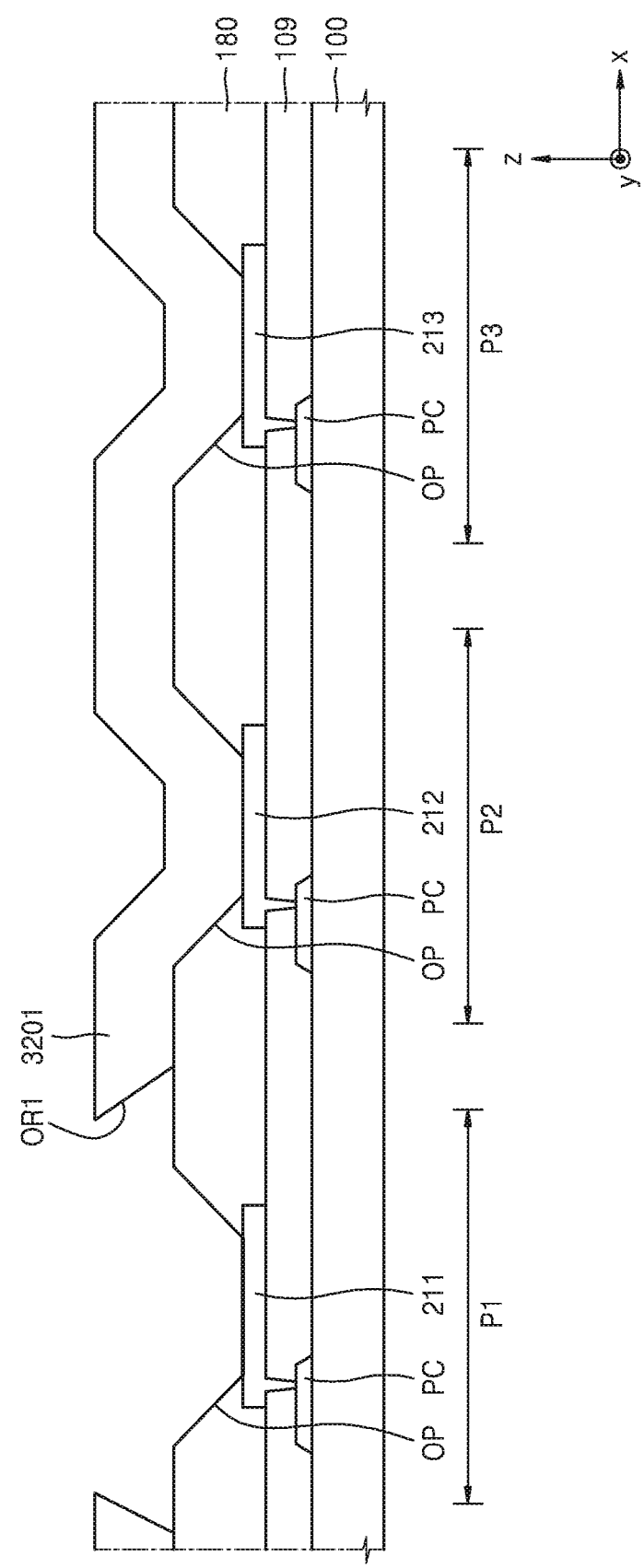

Referring to FIG. 7A, as described above with reference to FIG. 6A, the pixel circuits PC and the first to third pixel electrodes 211 to 213 electrically connected to the pixel circuits PC are formed above the substrate 100, and the pixel-defining layer 180 including the openings OP respectively exposing the first to third pixel electrodes 211 to 213 is formed. After that, the first photosensitive pattern layer 3201 is formed above the pixel-defining layer 180. The first photosensitive pattern layer 3201 includes the first opening region OR1 exposing the first pixel electrode 211. The first photosensitive pattern layer 3201 may include a negative photosensitive material. The first photosensitive pattern layer 3201 may be formed by a process, which is described below in more detail.

After a photoresist layer (not shown) including a negative photosensitive material is formed above the substrate 100 including the pixel-defining layer 180, the first photosensitive pattern layer 3201 having the first opening region OR1 is formed by exposing and developing a partial region of the photoresist layer. In one or more exemplary embodiments, the first photosensitive pattern layer 3201 may have a reverse tapered shape by adjusting a progression direction of light when exposing the photoresist layer.

Figure 7B:
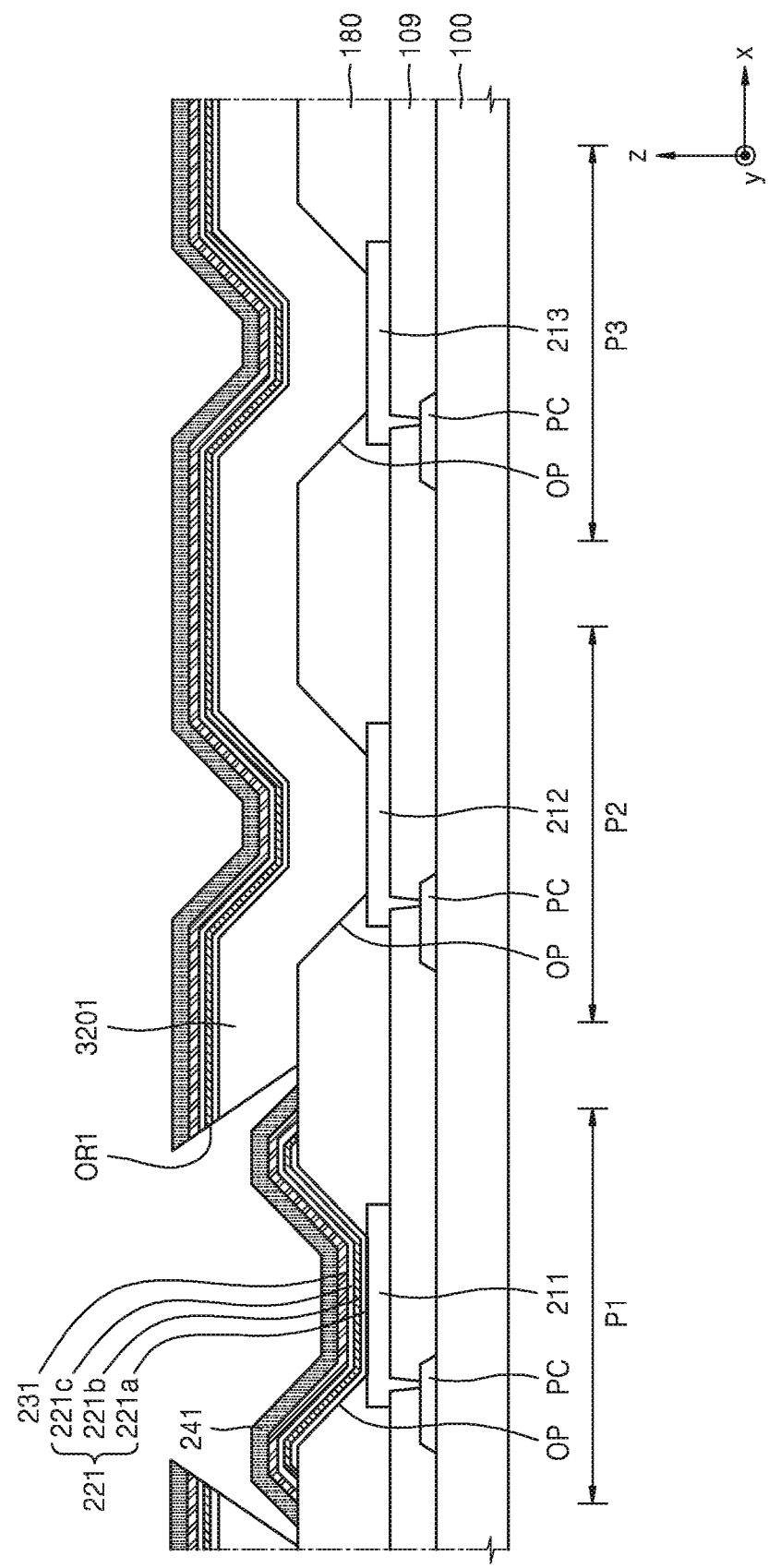

Referring to FIG. 7B, the first intermediate layer 221, the first opposite electrode 231, and the first protective layer 241 are sequentially formed above the substrate 100 including the first photosensitive pattern layer 3201, which is a masking pattern. The first intermediate layer 221, the first opposite electrode 231, and the first protective layer 241 are the same as described with reference to FIGS. 4 and 6C. Since the first photosensitive pattern layer 3201 has a reverse tapered shape, the first intermediate layer 221, the first opposite electrode 231, and the first protective layer 241 above the first pixel electrode 211 are spaced apart from the first intermediate layer 221, the first opposite electrode 231, and the first protective layer 241 above the first photosensitive pattern layer 3201.

Figure 7C:
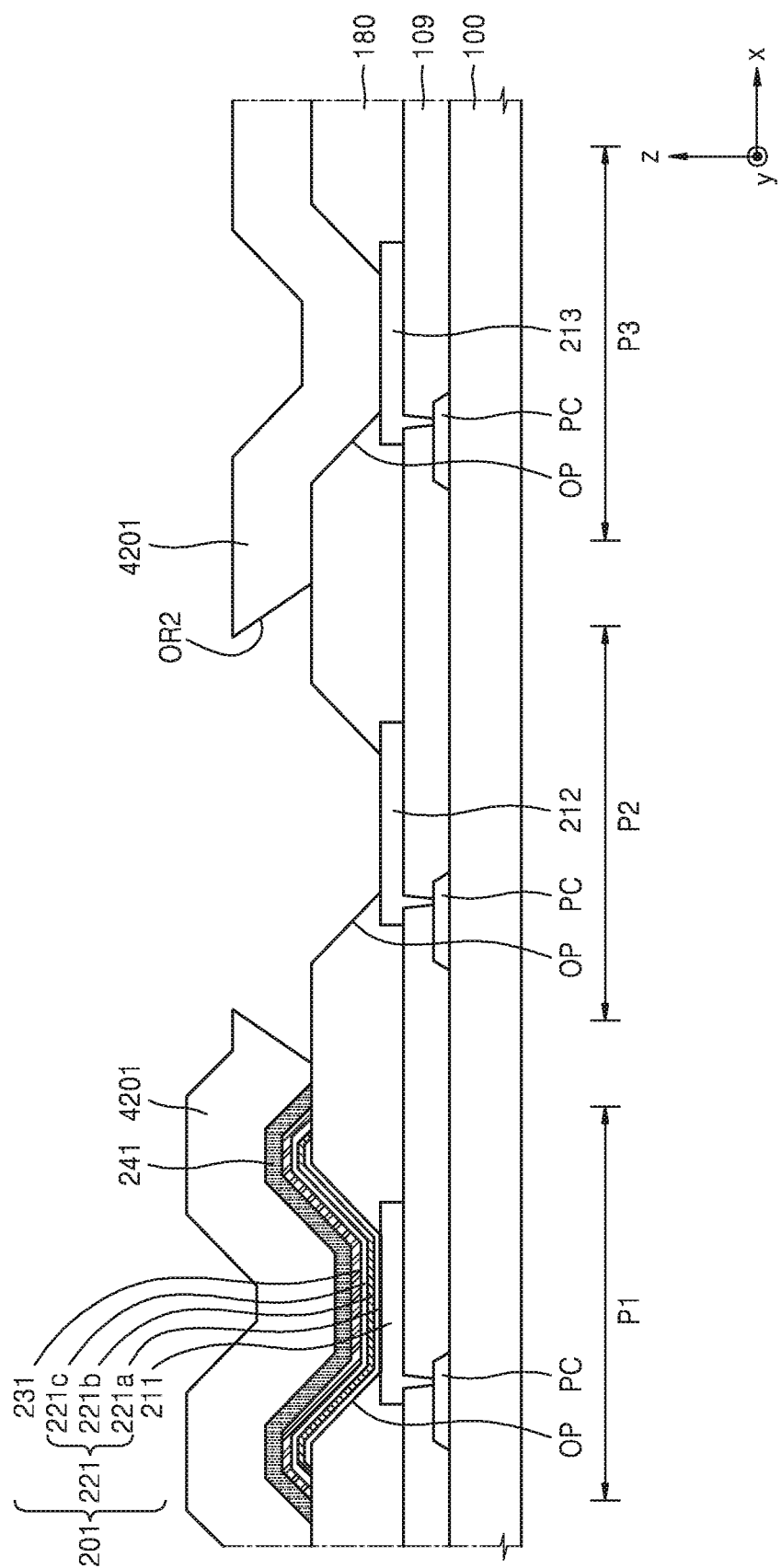

Referring to FIG. 7C, the first photosensitive pattern layer 3201, which is a masking pattern, is removed via a lift-off process. While the first photosensitive pattern layer 3201 is removed, the first intermediate layer 221, the first opposite electrode 231, and the first protective layer 241 above the first photosensitive pattern layer 3201 are removed together. Also, the island type pattern first intermediate layer 221, the first opposite electrode 231, and the first protective layer 241 remain in a region corresponding to the first pixel P1. The first protective layer 241 may protect the first OLED 201 during a lift-off. For example, the first protective layer 241 may prevent a material included in a solvent removing the first photosensitive pattern layer 3201 from penetrating into the first OLED 201 or damaging the first OLED 201.

Next, the second photosensitive pattern layer 4201 is formed above the first protective layer 241 and the pixel-defining layer 180. The second photosensitive pattern layer 4201 includes the second opening region OR2 exposing the second pixel electrode 212. The second photosensitive pattern layer 4201 may include a negative photosensitive material. The second photosensitive pattern layer 4201 may be formed by the same method as the method of forming the first photosensitive pattern layer 3201 and may have a reverse tapered shape. The first protective layer 241 may prevent (or at least reduce) a material included in the second photosensitive pattern layer 4201 from penetrating into the first OLED 201, or damaging the first OLED 201.

Figure 7D:
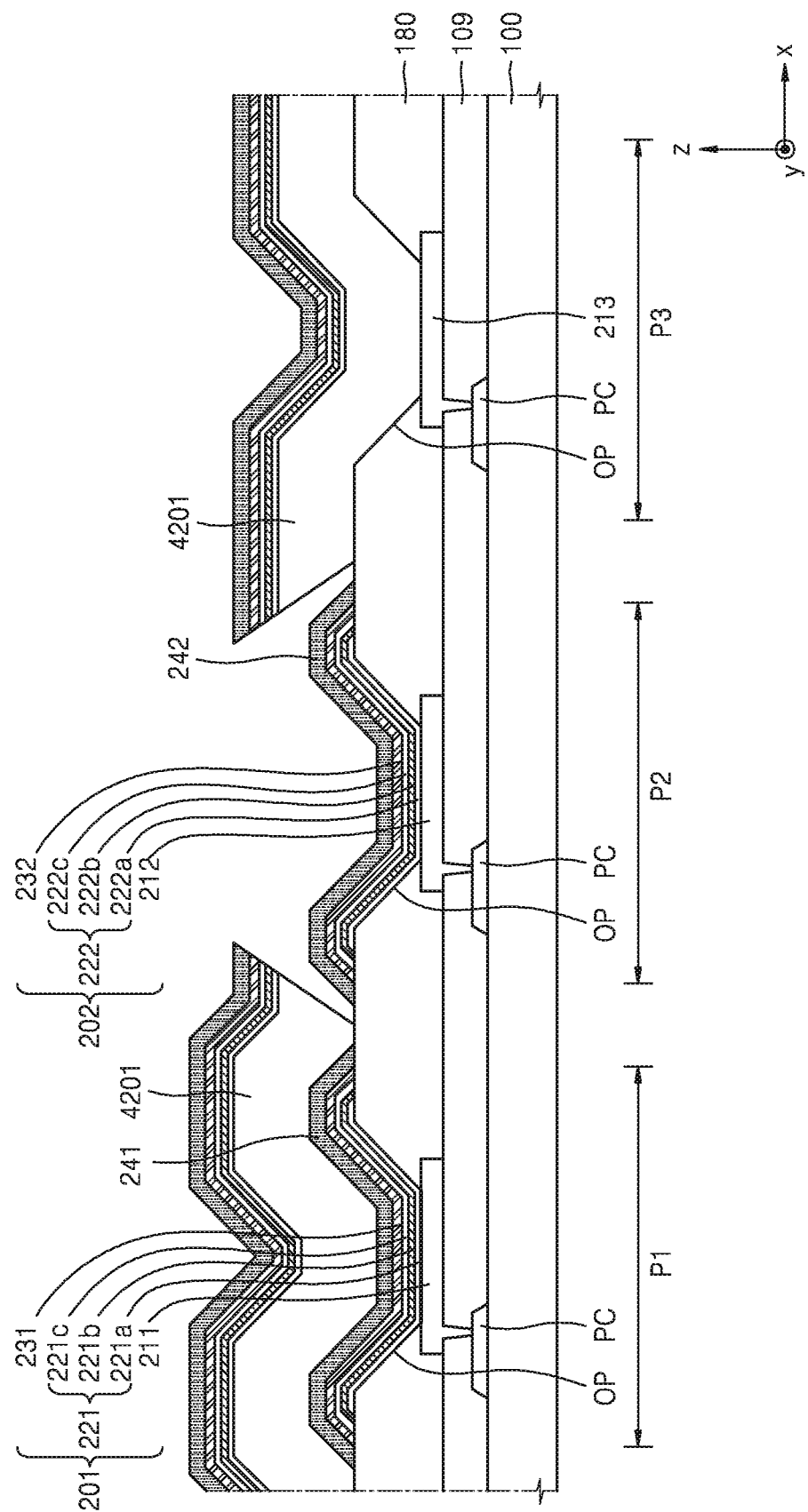

Referring to FIG. 7D, the second intermediate layer 222, the second opposite electrode 232, and the amorphous second protective layer 242 are sequentially formed above the substrate 100 including the second photosensitive pattern layer 4201, which is a masking pattern. Materials of the second intermediate layer 222, the second opposite electrode 232, and the amorphous second protective layer 242, a forming method thereof, the width of the first protective layer 241, etc., are the same as those previously described with reference to FIGS. 4 and 6F, and, as such, duplicative descriptions have been omitted to avoid obscuring exemplary embodiments. Since the second photosensitive pattern layer 4201 has a reverse tapered shape, the second intermediate layer 222, the second opposite electrode 232, and the amorphous second protective layer 242 above the second pixel electrode 212 are spaced apart from the second intermediate layer 222, the second opposite electrode 232, and the amorphous second protective layer 242 above the second photosensitive pattern layer 4201.

Figure 7E:
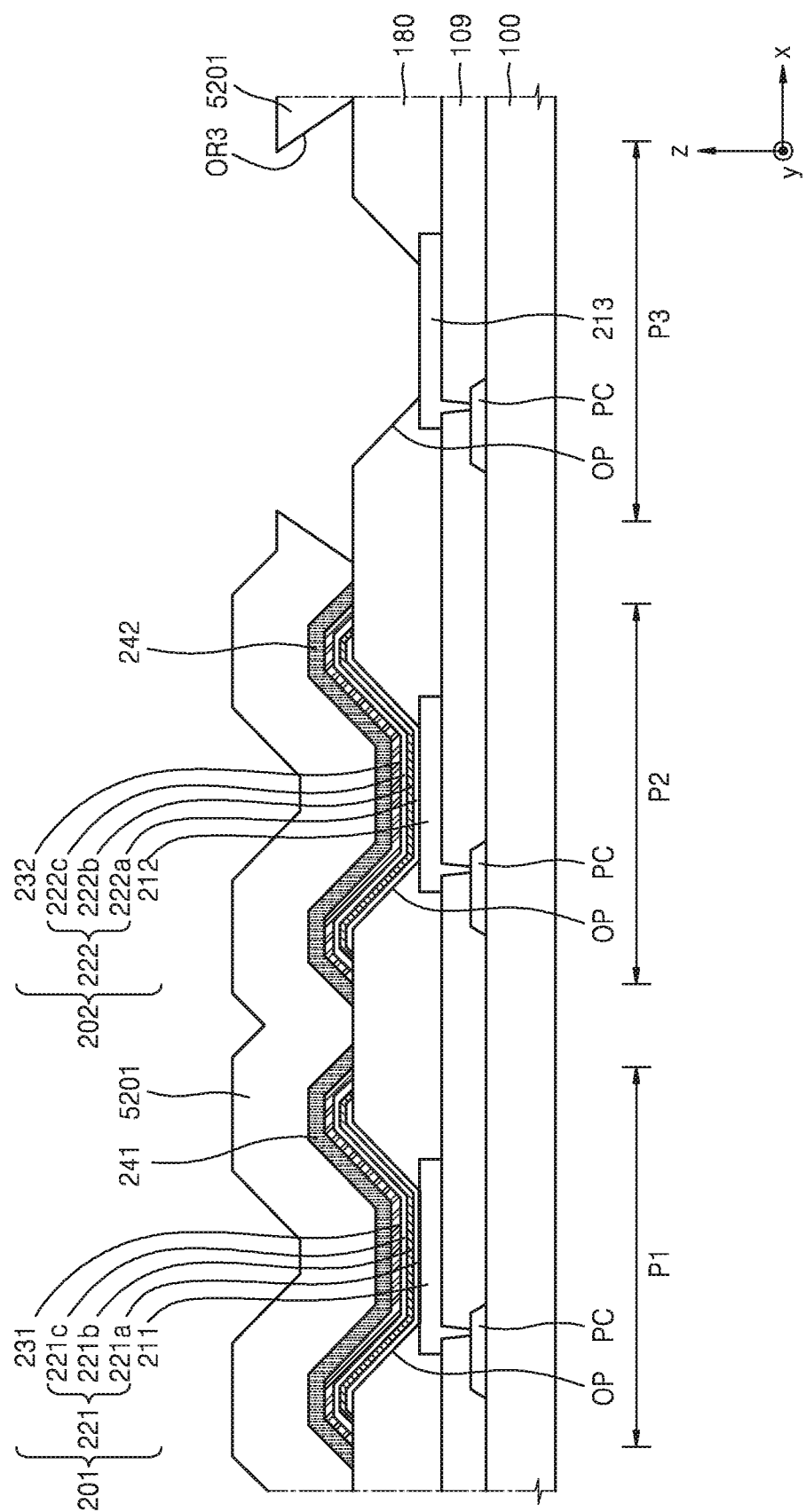

Referring to FIG. 7E, the second photosensitive pattern layer 4201, which is a masking pattern, is removed via a lift-off process. While the second photosensitive pattern layer 4201 is removed, the second intermediate layer 222, the second opposite electrode 232, and the amorphous second protective layer 242 above the second photosensitive pattern layer 4201 are removed together. Also, the island type pattern second intermediate layer 222, the second opposite electrode 232, and the amorphous second protective layer 242 remain in a region corresponding to the second pixel P2. The first and second protective layers 241 and 242 may protect the first and second OLEDs 201 and 202 during a lift-off process. For example, the first and second protective layers 241 and 242 may prevent (or at least reduced) a material included in a solvent removing the second photosensitive pattern layer 4201 from penetrating into the first and second OLEDs 201 and 202 or damaging the first and second OLEDs 201 and 202.

Next, the third photosensitive pattern layer 5201 is formed above the first and second protective layers 241 and 242 and the pixel-defining layer 180. The third photosensitive pattern layer 5201 includes the third opening region OR3 exposing the third pixel electrode 213. The third photosensitive pattern layer 5201 may include a negative photosensitive material, which is a masking pattern. The third photosensitive pattern layer 5201 may be formed by the same method as the method of forming the first and second photosensitive pattern layers 3201 and 4201, and may have a reverse tapered shape. The first and second protective layers 241 and 242 may prevent (or at least reduce) a material included in the third photosensitive pattern layer 5201 from penetrating into the first and second OLEDs 201 and 202, or damaging the first and second OLEDs 201 and 202.

Figure 7F:
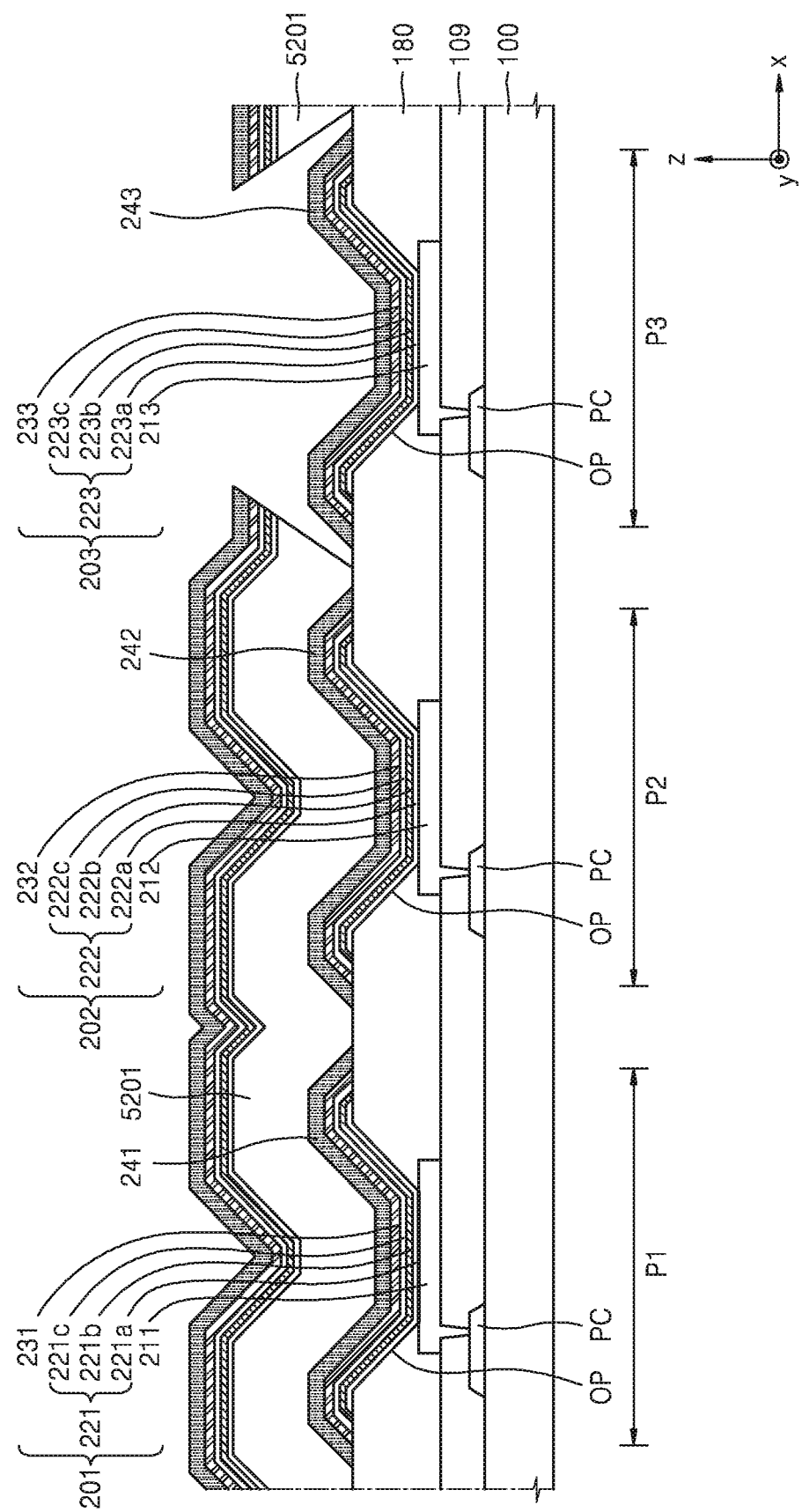

Referring to FIG. 7F, the third intermediate layer 223, the third opposite electrode 233, and the amorphous third protective layer 243 are sequentially formed above the substrate 100 including the third photosensitive pattern layer 5201, which is a masking pattern. Materials of the third intermediate layer 223, the third opposite electrode 233, and the amorphous third protective layer 243, a forming method thereof, the width of the first protective layer 241, etc., are the same as those previously described with reference to FIGS. 4 and 6I. Since the third photosensitive pattern layer 5201 has a reverse tapered shape, the third intermediate layer 223, the third opposite electrode 233, and the amorphous third protective layer 243 above the third pixel electrode 213 are spaced apart from the third intermediate layer 223, the third opposite electrode 233, and the amorphous third protective layer 243 above the third photosensitive pattern layer 5201.

Referring to FIG. 7G, the third photosensitive pattern layer 5201, which is a masking pattern, is removed via a lift-off process. While the third photosensitive pattern layer 5201 is removed, the third intermediate layer 223, the third opposite electrode 233, and the amorphous third protective layer 243 above the third photosensitive pattern layer 5201 are removed together. Also, the island type pattern third intermediate layer 223, third opposite electrode 233, and amorphous third protective layer 243 remain in a region corresponding to the third pixel P3. The first to third protective layers 241 to 243 may protect the first to third OLEDs 201 to 203 during a lift-off process. For example, the first to third protective layers 241 to 243 may prevent (or at least reduce) a material included in a solvent removing the third photosensitive pattern layer 5201 from penetrating into the first to third OLEDs 201 to 203 or damaging the first to third OLEDs 201 to 203. Thereafter, the connection layer 250 and the encapsulation layer 260 are formed. The encapsulation layer 260 may include at least one organic layer 261 and at least one inorganic layer 263 as described with reference to FIG. 4.

Figure 8:
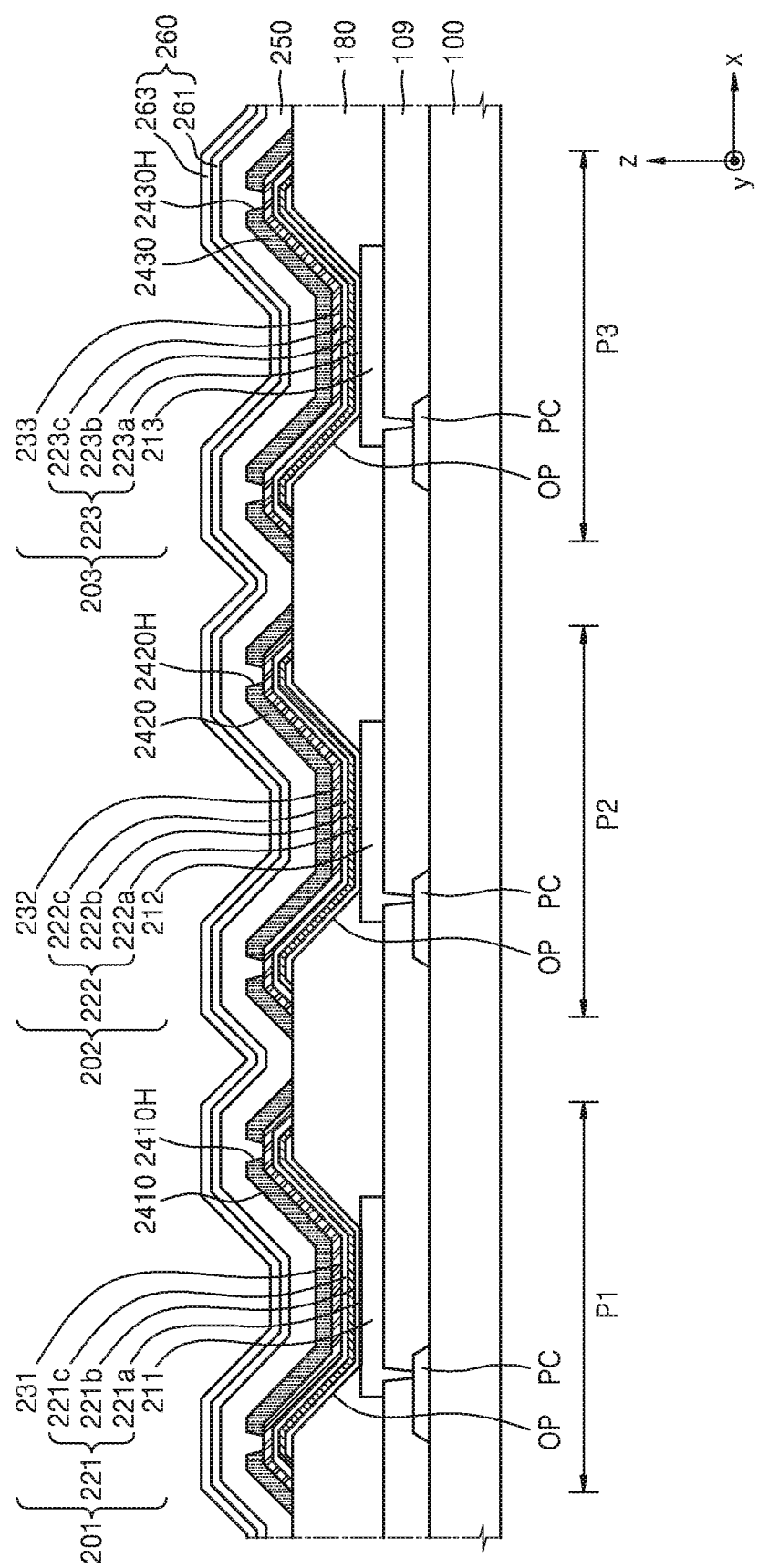
FIG. 8 is a cross-sectional view of an organic light-emitting display device, according to one or more exemplary embodiments.

FIG. 8 is a cross-sectional view of an organic light-emitting display device, according to one or more exemplary embodiments. The organic light-emitting display device of FIG. 8 is the same as (or at least similar to) the organic light-emitting display device of FIG. 4 in its construction of the first to third pixel electrodes 211 to 213, the first to third intermediate layers 221 to 223, the first to third opposite electrodes 231 to 233, the connection layer 250, and the encapsulation layer 260. In this manner, the organic light-emitting display device of FIG. 8 is different with respect to first to third protective layers 2410 to 2430 that are different from the first to third protective layers 241 to 243 of the organic light-emitting display device described with reference to FIG. 4. Accordingly, duplicative descriptions are primarily omitted to avoid obscuring exemplary embodiments, and the first to third protective layers 2410 to 2430 are mainly described.

Referring to FIG. 8, the first to third protective layers 2410 to 2430 respectively cover the first to third opposite electrodes 231 to 233 and may have widths greater than the widths of the first to third opposite electrodes 231 to 233. In this manner, ends of the first to third protective layers 2410 to 2430 may directly contact the pixel-defining layer 180 beyond the first to third opposite electrodes 231 to 233.

The first to third protective layers 2410 to 2430 may include an amorphous material. For example, the first to third protective layers 2410 to 2430 may include an amorphous insulating inorganic material. For example, the first to third protective layers 2410 to 2430 may include at least one of oxides, such as $SiO_x$, $AlO_x$, $HfO_2$, $ZnO_2$, $Ta_2O_5$, $TiO_2$, oxynitrides, such as SiON, and nitrides, such as $SiN_x$. It is also noted that the first to third protective layers 2410 to 2430 may include a single layer or multiple layer structure including the aforementioned amorphous materials. In one or more exemplary embodiments, the first to third protective layers 2410 to 2430 may have a minimum thickness of about 10 Å. For example, each of the first to third protective layers 2410 to 2430 may have a thickness of about 100 Å to about 300 Å by taking into account materials such as the above PGMEA and TMAH and materials such as $H_2O$ and $O_2$. If the first to third protective layers 2410 to 2430 have a thickness less than the minimum thickness of about 10 Å, the first to third OLEDs 201 to 203 may be damaged during the lift-off process(es).

In one or more exemplary embodiments, the first to third protective layers 2410 to 2430 may include first to third contact holes 2410H, 2420H, and 2430H for electric connection between the connection layer 250 and the first to third opposite electrodes 231 to 233.

Figure 9A:
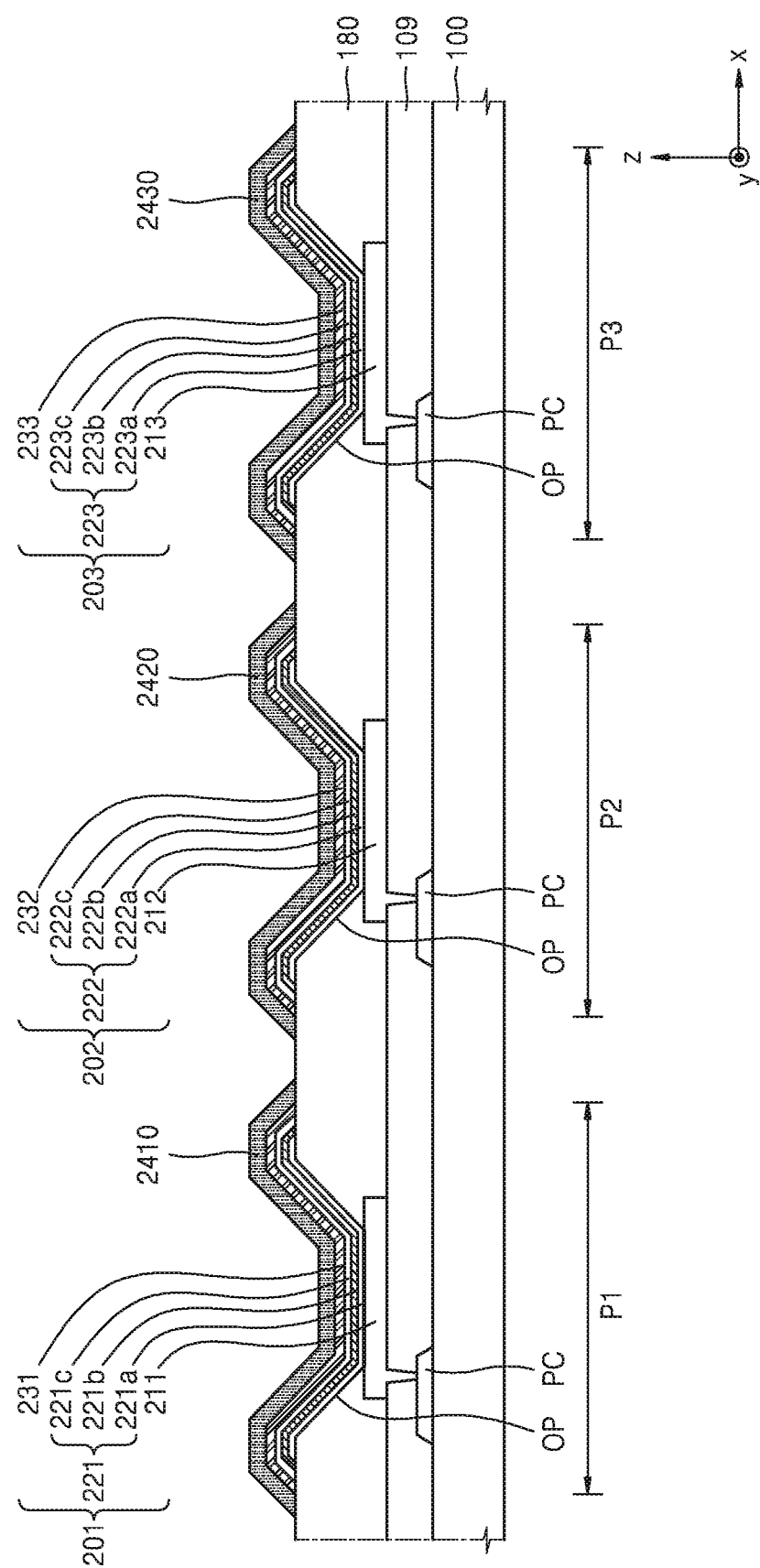
FIGS. 9A, 9B, and 9C are cross-sectional views of an organic light-emitting display device at various stages of manufacture, according to one or more exemplary embodiments.
Figure 9B:
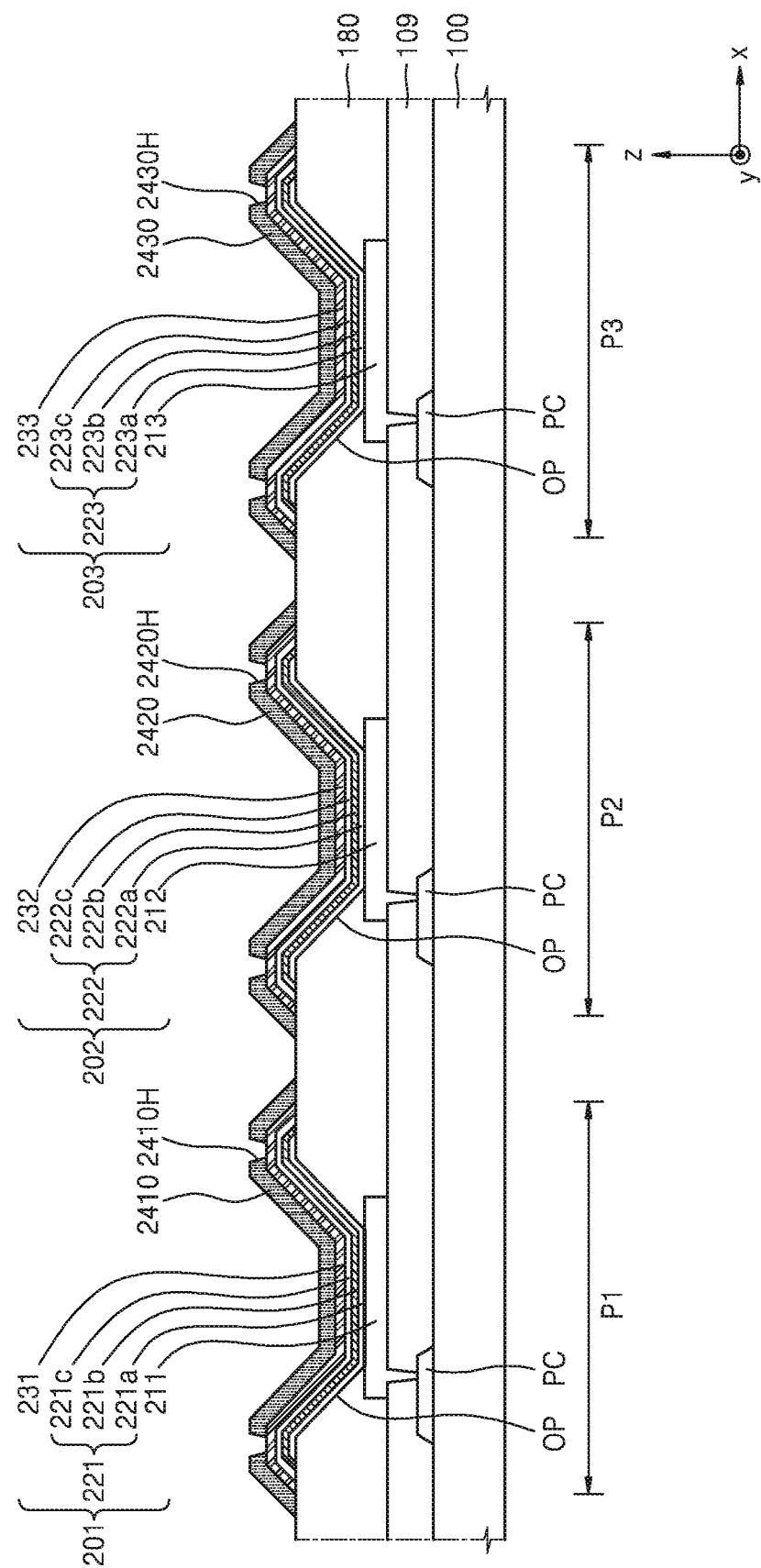
Figure 9C:
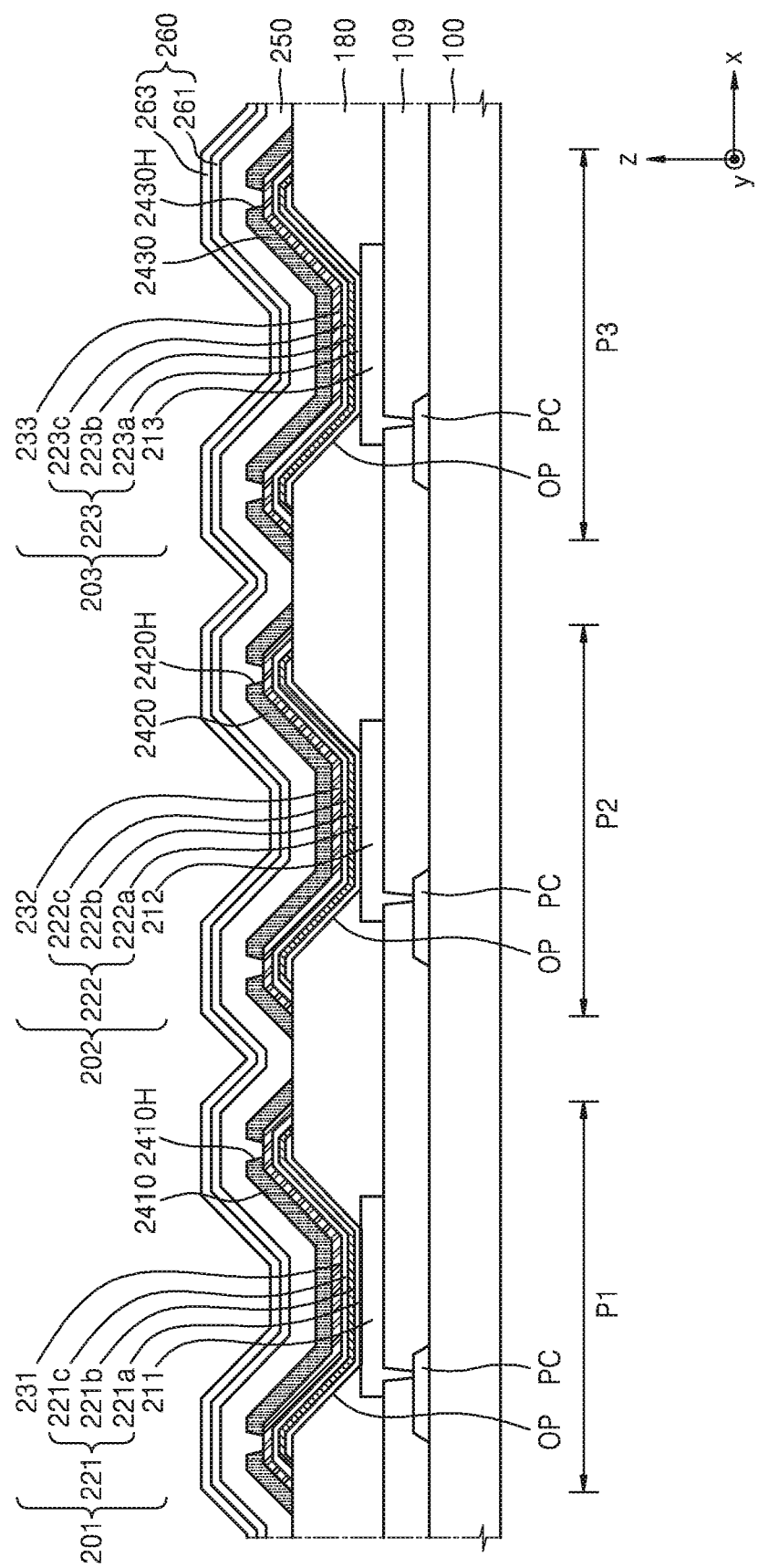

FIGS. 9A to 9C are cross-sectional views of an organic light-emitting display device at various stages of manufacture, according to one or more exemplary embodiments.

Referring to FIG. 9A, the first to third OLEDs 201 to 203 and the first to third protective layers 2410 to 2430 covering the first to third OLEDs 201 to 203 are respectively formed in the first to third pixels P1 to P3 of the substrate 100. A process of forming the first to third OLEDs 201 to 203 and the first to third protective layers 2410 to 2430 covering the first to third OLEDs 201 to 203 is substantially the same as the method described with reference to FIGS. 6A to 6J, or the method described with reference to FIGS. 7A to 7F with the only difference of forming the first to third protective layers 2410 to 2430 via a process, such as a PECVD.

Referring to FIG. 9B, first to third contact holes 2410H, 2420H, and 2430H exposing a portion of the first to third opposite electrodes 231 to 233 are formed by etching partial regions of the first to third protective layers 2410 to 2430. Referring to FIG. 9C, the connection layer 250 is formed to cover all of the first to third pixels P1 to P3, and the encapsulation layer 260 including at least one organic layer 261 and at least one inorganic layer 263 is formed above the connection layer 250. According to one or more exemplary embodiments, the first to third protective layers 2410 to 2430 may prevent (or at least reduce) a material included in a masking pattern or a material used for removing the masking pattern, etc., from penetrating into the first to third OLEDs 201 to 203 or damaging the first to third OLEDs 201 to 203 during a manufacturing process of an organic light-emitting display device manufactured via a lift-off process.

Referring to FIGS. 8 to 9C, although it has been described that the first to third opposite electrodes 231 to 233 are connected to the connection layer 250 via contact holes defined in the first to third protective layers 2410 to 2430 in the case where the first to third protective layers 2410 to 2430 have insulation, exemplary embodiments are not limited thereto or thereby. For instance, as described above with reference to FIG. 4, even when the first to third protective layers 241 to 243 have conductivity, contact holes for direct contact between the first to third opposite electrodes 231 to 233 and the connection layer 250 may be formed in the first to third protective layers 241 to 243.

According to one or more exemplary embodiments, the above-described first to third protective layers 241, 242, 243, 2410, 2420, and 2430 may serve as encapsulation layers protecting (or at least reducing deleterious effects associated with) the first to third OLEDs 201 to 203 from moisture, oxygen, etc., together with the encapsulation layer 260 by adjusting a thickness of the first to third protective layers 241, 242, 243, 2410, 2420, and 2430, such that a moisture transmission rate WVTR thereof is about $10^{-1}$ $g/cm^2/day$.

In one or more exemplary embodiments, since the organic light-emitting display device having the above-described structure is not formed with a deposition mask including a material such as INVAR closely attached to the substrate, a chopping or imprinting phenomenon by the deposition mask may be prevented. Also, a separate spacer for supporting the deposition mask does not need to be formed above the pixel-defining layer, and the height of the pixel-defining layer does not need to be formed as high as about 2.5-3.5 μm. That is, since the pixel-defining layer may be formed to about 100 nm or less, the organic light-emitting display device having the above-described structure is improved in aspects of process and manufacturing costs.

According to one or more exemplary embodiments, since patterning is performed on a pixel-by-pixel basis via a lift-off process, a distance of an intermediate layer may be formed different on a pixel-by-pixel basis. In this manner, the distance of the intermediate layer may be designed by taking into account an optical revolution distance.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an organic light-emitting display device, the method comprising:
   forming first and second pixel electrodes on a substrate;
   forming a pixel-defining layer on the first and second pixel electrodes, the pixel-defining layer comprising first and second openings respectively exposing the first and second pixel electrodes;
   forming a first photosensitive pattern layer on the pixel-defining layer, the first photosensitive pattern layer comprising a first opening region exposing the first pixel electrode;
   forming a first multilayer structure on the first pixel electrode and the first photosensitive pattern layer, the first multilayer structure comprising, in sequence, a first intermediate layer, a first opposite electrode, and a first protective layer; and
   removing the first photosensitive pattern layer, wherein the first intermediate layer comprises an emission layer, and wherein, after removing the first photosensitive pattern layer, a portion of the first multilayer structure remains on the first pixel electrode.

2. The method of claim 1, wherein the first intermediate layer further comprises at least one of a hole injection layer, a hole transport layer, an electron transport layer, and an electron injection layer.

3. The method of claim 1, wherein the first protective layer is wider than the first opposite electrode.

4. The method of claim 3, wherein an end of the first protective layer contacts the pixel-defining layer.

5. The method of claim 1, wherein the first opposite electrode comprises a metallic layer.

6. The method of claim 1, wherein the first opposite electrode comprises at least one of Ag, Mg, Al, Yb, Ca, Li, Au, and LiF.

7. The method of claim 1, wherein the first protective layer comprises an amorphous material.

8. The method of claim 7, wherein the first protective layer comprises an amorphous conductive oxide.

9. The method of claim 8, wherein the first protective layer comprises at least one of an amorphous transparent conductive oxide and a transparent amorphous oxide semiconductor.

10. The method of claim 9, wherein the first protective layer comprises an amorphous insulating inorganic material.

11. The method of claim 10, wherein the first protective layer comprises at least one of an oxide, an oxynitride, and a nitride.

12. The method of claim 1, wherein:

forming the first photosensitive pattern layer comprises forming a first auxiliary layer;

the first auxiliary layer is disposed between the first photosensitive pattern layer and the pixel-defining layer; and the first auxiliary layer comprises an opening region corresponding to the first opening region.

13. The method of claim 12, wherein the opening region in the first auxiliary layer is larger than the first opening region in the first photosensitive pattern layer.

14. The method of claim 1, further comprising:

forming a second photosensitive pattern layer on the first protective layer and the pixel-defining layer, the second photosensitive pattern layer comprising a second opening region exposing the second pixel electrode;

forming a second multilayer structure on the second pixel electrode and the second photosensitive pattern layer, the second multilayer structure comprising, in sequence, a second intermediate layer, a second opposite electrode, and a second protective layer; and removing the second photosensitive pattern layer, wherein the second intermediate layer comprises an emission layer, and wherein, after removing the second photosensitive pattern layer, a portion of the second multilayer structure remains on the second pixel electrode.

15. The method of claim 14, further comprising:

forming a through hole passing through the first and second protective layers; and forming a connection layer on the first and second protective layers.

16. The method of claim 15, wherein the connection layer is integrally formed and covers the first and second protective layers.

* * * * *